United States Patent
Park et al.

(10) Patent No.: US 11,901,187 B2
(45) Date of Patent: Feb. 13, 2024

(54) SEMICONDUCTOR DEVICE INCLUDING HARD MASK STRUCTURE WITH REPEATING SPIN-ON HARD MASK LAYERS

(71) Applicant: Samsung Electronics Co., Ltd., Suwon-si (KR)

(72) Inventors: Hwanyeol Park, Seoul (KR); Jongyoung Park, Seoul (KR); Yongdeok Lee, Suwon-si (KR); Sejin Kyung, Seoul (KR); Daewee Kong, Yongin-si (KR); Ilwoo Kim, Yongin-si (KR); Songyi Baek, Hwaseong-si (KR); Philippe Coche, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 229 days.

(21) Appl. No.: 17/522,193

(22) Filed: Nov. 9, 2021

(65) Prior Publication Data
US 2022/0344166 A1    Oct. 27, 2022

(30) Foreign Application Priority Data

Apr. 23, 2021    (KR) .................. 10-2021-0053266

(51) Int. Cl.
*H01L 21/308* (2006.01)
*H01L 21/768* (2006.01)
(Continued)

(52) U.S. Cl.
CPC .... *H01L 21/3086* (2013.01); *H01L 21/02129* (2013.01); *H01L 21/76829* (2013.01);
(Continued)

(58) Field of Classification Search
CPC .......... H01L 21/3086; H01L 21/02129; H01L 21/76829; H01L 28/40; H01L 28/60;
(Continued)

(56) References Cited

U.S. PATENT DOCUMENTS 6,818,141 B1    11/2004    Plat et al.
7,226,853 B2    6/2007    Bekiaris et al.
(Continued)

FOREIGN PATENT DOCUMENTS

KR    100640640 B1    10/2006
KR    100896451 B1    5/2009
(Continued)

OTHER PUBLICATIONS

Taiwanese Notice of Allowance dated Sep. 19, 2023 for corresponding Taiwanese Application No. 111101244.

*Primary Examiner* — John P. Dulka
(74) *Attorney, Agent, or Firm* — Harness, Dickey & Pierce, P.L.C.

(57) ABSTRACT

Provided is a semiconductor device. The semiconductor device includes a wafer; an etch stop layer on the wafer; a lower mold layer on the etch stop layer; an intermediate supporter layer on the lower mold layer; an upper mold layer on the intermediate supporter layer; an upper supporter layer on the upper mold layer; and a hard mask structure on the upper supporter layer, wherein the hard mask structure includes a first hard mask layer on the upper supporter layer and a second hard mask layer on the first hard mask layer, one of the first hard mask layer and the second hard mask layer includes a first organic layer including a SOH containing C, H, O, and N, and the other one of the first hard mask layer and the second hard mask layer includes a second organic layer including an SOH containing C, H, and O.

20 Claims, 25 Drawing Sheets

(51) Int. Cl.
　　　*H01L 21/02* (2006.01)
　　　*H01L 29/06* (2006.01)
　　　*H01L 49/02* (2006.01)
(52) U.S. Cl.
　　　CPC .............. *H01L 28/40* (2013.01); *H01L 28/60* (2013.01); *H01L 29/06* (2013.01)
(58) Field of Classification Search
　　　CPC . H01L 29/06; H01L 21/02118; H01L 21/022; H01L 21/02282; H01L 21/0271; H01L 21/0332; H01L 21/31144; H10B 12/30; H10B 12/033
　　　See application file for complete search history.

(56) References Cited

U.S. PATENT DOCUMENTS

| | | |
|---|---|---|
| 7,473,647 B2 | 1/2009 | Lee et al. |
| 7,862,990 B2 | 1/2011 | Yoon et al. |
| 7,947,609 B2 | 5/2011 | Feurprier |
| 8,153,349 B2 | 4/2012 | Cheon et al. |
| 9,046,764 B2 | 6/2015 | Tachibana et al. |
| 9,324,569 B2 | 4/2016 | Ishii |
| 9,461,058 B2 | 10/2016 | Song et al. |
| 10,510,586 B1 | 12/2019 | Liou et al. |
| 10,727,274 B2 | 7/2020 | Chen et al. |
| 10,854,452 B2 | 12/2020 | Kim et al. |
| 2016/0266494 A1 | 9/2016 | Kim et al. |
| 2017/0365487 A1* | 12/2017 | Shen ................. H01L 21/30604 |
| 2019/0131140 A1* | 5/2019 | Sun ........................ C09K 13/00 |
| 2020/0402838 A1* | 12/2020 | Gu .................... H01L 21/76224 |

FOREIGN PATENT DOCUMENTS

| | | |
|---|---|---|
| KR | 100930673 B1 | 12/2009 |
| KR | 101961496 B1 | 3/2019 |
| TW | 201617291 A | 5/2016 |
| TW | 201637093 A | 10/2016 |
| TW | 201720874 A | 6/2017 |

* cited by examiner

FIG. 4A

| CHON based SOH | — H2 |
| CHO based SOH | — H1 |

HMa

FIG. 4B

HMb

| CHO based SOH | —H1 |
| CHON based SOH | —H2 |

FIG. 4C

HMc

| CHON based SOH | ~H2 |
| CHO based SOH | ~H1 |
| CHON based SOH | ~H2 |
| CHO based SOH | ~H1 |
| CHON based SOH | ~H2 |
| CHO based SOH | ~H1 |

FIG. 4H

HMh

| Si | — H4 |
| CHON based SOH | — H2 |
| CHO based SOH | — H1 |

FIG. 4I

HMi

| SiX | — H4i |
| CHON based SOH | — H2 |
| CHO based SOH | — H1 |

FIG. 4J

HMj

| SiXY | — H4j |
| CHON based SOH | — H2 |
| CHO based SOH | — H1 |

SEMICONDUCTOR DEVICE INCLUDING HARD MASK STRUCTURE WITH REPEATING SPIN-ON HARD MASK LAYERS

CROSS-REFERENCE TO RELATED APPLICATION

This application is based on and claims priority under 35 U.S.C. § 119 to Korean Patent Application No. 10-2021-0053266, filed on Apr. 23, 2021, in the Korean Intellectual Property Office, the disclosure of which is incorporated by reference herein in its entirety.

BACKGROUND

Inventive concepts relate to a semiconductor device, and more particularly, to a semiconductor device including a hard mask structure.

A hard mask may be formed through chemical vapor deposition (CVD). However, particles formed through CVD may cause defects. Alternatively or additionally, because a CVD process is performed in a vacuum state, independent equipment is used/needed. Instead of a previous hard mask formed through a CVD process, a hard mask formed through spin coating has been suggested. A hard mask formed through spin coating is referred to as a spin-on hard (SOH) mask.

SUMMARY

Inventive concepts provide a semiconductor device including a hard mask structure having a high etch selectivity, which may be capable of preventing or reducing the likelihood of breaking/destruction due to thermal stress. Alternatively or additionally, inventive concepts also provide a semiconductor device including a hard mask structure that helps gases of organic byproducts to escape from a hard mask, so as to reduce stress due to the gases.

According to some example embodiments of inventive concepts, there is provided a semiconductor device including a wafer; an etch stop layer on the wafer; a lower mold layer on the etch stop layer; an intermediate supporter layer on the lower mold layer; an upper mold layer on the intermediate supporter layer; an upper supporter layer on the upper mold layer; and a hard mask structure on the upper supporter layer, wherein the hard mask structure includes a first hard mask layer on the upper supporter layer and a second hard mask layer on the first hard mask layer, one of the first hard mask layer and the second hard mask layer includes a first organic layer including a spin on hard mask (hereinafter referred to as an SOH) containing carbon (C), hydrogen (H), oxygen (O), and nitrogen (N), and the other one of the first hard mask layer and the second hard mask layer includes a second organic layer including an SOH containing C, H, and O.

According to some example embodiments of inventive concepts, there is provided a semiconductor device including a wafer including a non-edge portion and an edge portion around the non-edge portion; a capacitor structure on the non-edge portion of the wafer; and a supporting structure on the edge portion of the wafer. The supporting structure includes an etch stop layer, a lower mold layer, an intermediate supporter layer, an upper mold layer, an upper supporter layer, and a hard mask structure that are sequentially stacked on the edge portion of the wafer, the supporting structure shares the etch stop layer, the intermediate supporter layer, and the upper supporter layer with the capacitor structure, the hard mask structure includes a first hard mask layer and a second hard mask layer sequentially stacked on the upper supporter layer, one of the first hard mask layer and the second hard mask layer includes a spin on hard mask (SOH) layer containing carbon (C), hydrogen (H), oxygen (O), and nitrogen (N), and the other one of the first hard mask layer and the second hard mask layer includes an SOH layer containing C, H, and O.

According to some example embodiments of inventive concepts, there is provided a semiconductor device including a wafer including a non-edge portion and an edge portion around the non-edge portion; a capacitor structure on the non-edge portion of the wafer; and a supporting structure on the edge portion of the wafer. The capacitor structure includes an etch stop layer, an intermediate supporter layer spaced apart from the etch stop layer in a vertical direction, an upper supporter layer spaced apart from the intermediate supporter layer in the vertical direction, a plurality of lower electrodes penetrating through the etch stop layer, the intermediate supporter layer, and the upper supporter layer, a dielectric layer over the lower electrodes, and an upper electrode on the dielectric layer, the supporting structure shares the etch stop layer, the intermediate supporter layer, and the upper supporter layer with the capacitor structure and further includes an upper mold layer between the etch stop layer and the intermediate supporter layer, an upper mold layer between the intermediate supporter layer and the upper supporter layer, and a hard mask structure on the upper supporter layer, the hard mask structure includes a first hard mask layer and a second hard mask layer sequentially stacked on the upper supporter layer, one of the first hard mask layer and the second hard mask layer includes a spin on hard mask (SOH) layer containing carbon (C), hydrogen (H), oxygen (O), and nitrogen (N), and the other one of the first hard mask layer and the second hard mask layer includes an SOH layer containing C, H, and O.

BRIEF DESCRIPTION OF THE DRAWINGS

Some example embodiments of inventive concepts will be more clearly understood from the following detailed description taken in conjunction with the accompanying drawings in which:

FIGS. 4A to 4L are cross-sectional views of hard mask structures included in a semiconductor device according to some example embodiments of inventive concepts;

DETAILED DESCRIPTION OF SOME EXAMPLE EMBODIMENTS

Figure 1:
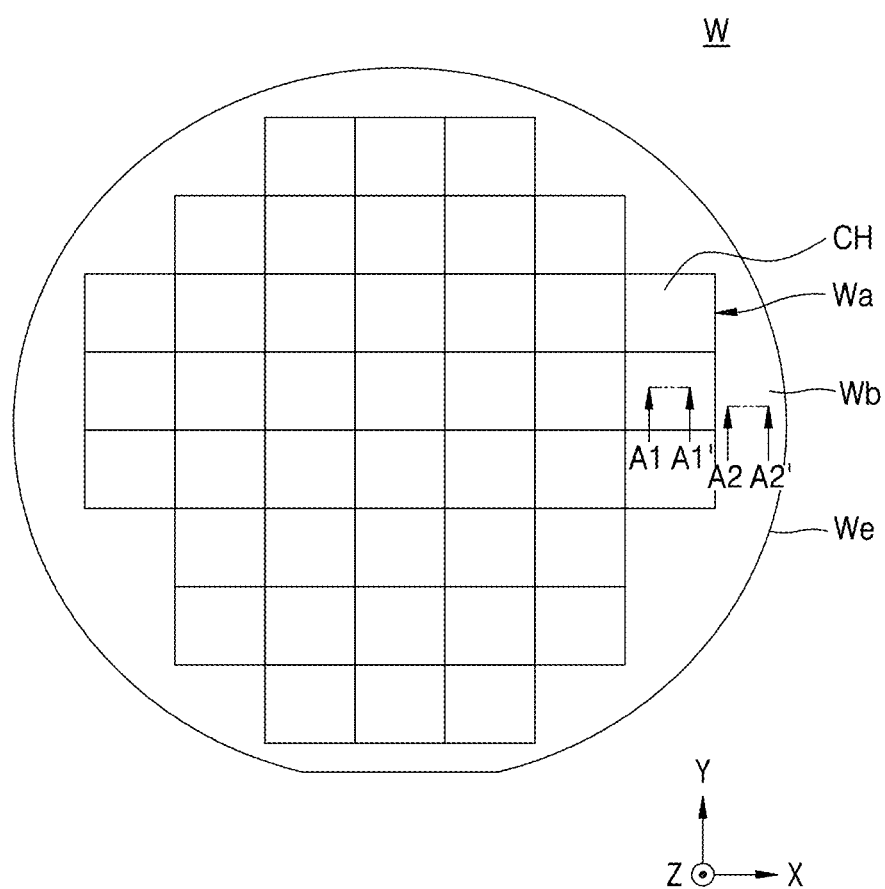
FIG. 1 is a plan view of a wafer included in a semiconductor device according to some example embodiments of inventive concepts.
Figure 2:
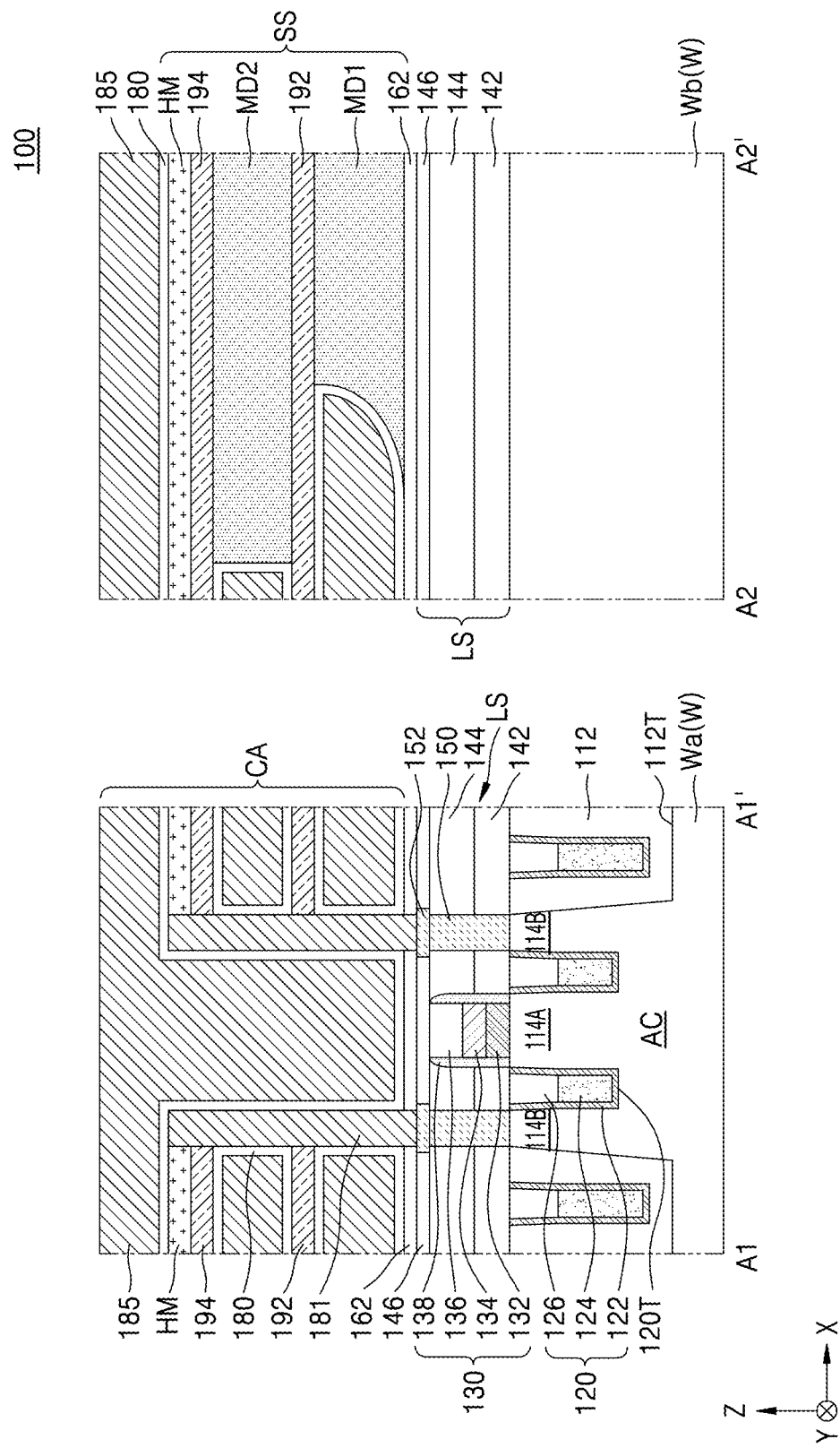
FIG. 2 is a cross-sectional view of a semiconductor device according to some example embodiments of inventive concepts.
Figure 3:
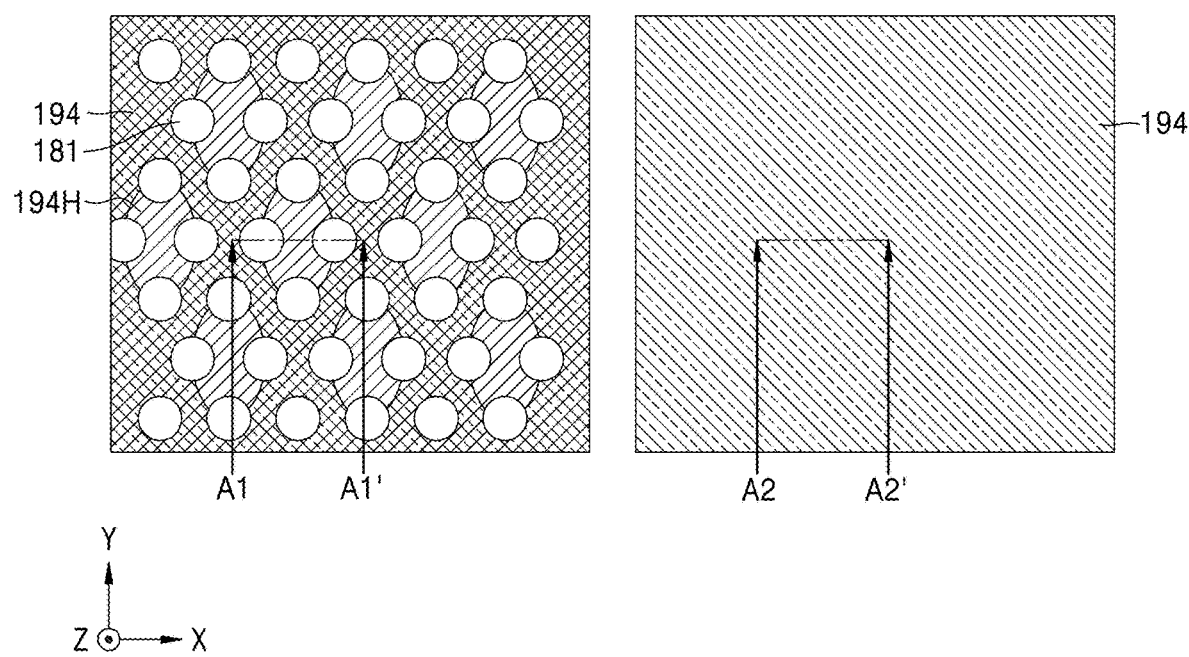
FIG. 3 is a plan view of an upper supporter layer and a lower electrode included in a semiconductor device according to some example embodiments of inventive concepts.

FIG. 1 is a plan view of a wafer W included in a semiconductor device according to some example embodiments of inventive concepts. FIG. 2 is a cross-sectional view of a semiconductor device 100 according to some example embodiments of inventive concepts. FIG. 3 is a plan view of an upper supporter layer 194 and a lower electrode 181 included in the semiconductor device 100 according to some example embodiments of inventive concepts. FIG. 2 corresponds to a line A1-A1' and a line A2-A2' of FIG. 3.

Referring to FIGS. 1 to 3, the wafer W may include a non-edge portion such as a mid-radius portion/center portion Wa and an edge portion Wb around the non-edge portion. Rectangles in the center portion Wa of the wafer W represent semiconductor die/semiconductor chips CH, respectively. Semiconductor chips CH may be formed at the center portion Wa of the wafer W. No semiconductor chip CH, or no fully formed semiconductor chip CH, may be formed at the edge portion Wb of the wafer W. The edge portion Wb of the wafer W may extend from the outline of the center portion Wa of the wafer W to an edge We of the wafer W.

The edge portion Wb may include a dummy-patterned region, wherein only portions of the semiconductor chip CH is formed. The edge portion Wb may include a wafer edge exclusion (WEE) zone, around an outer perimeter of the wafer W.

The shape and/or size and/or number of semiconductor chips CH on the wafer W is not limited to FIG. 1. For example, a number of semiconductor chips CH may be greater than, or less than, the number illustrated in FIG. 1. The semiconductor chips CH may be rectangular, such as square; however, example embodiments are not limited thereto. Furthermore, there may be a flat portion of the wafer, and/or there may be a notch portion of the wafer (not illustrated); however, example embodiments are not limited thereto. A diameter of the wafer W may be 200 mm, or alternatively may be 300 mm, or alternatively may be 450 mm; however, example embodiments are not limited thereto.

The wafer W may be doped or undoped single crystal; however, example embodiments are not limited thereto. The wafer W may include a semiconductor material like a group IV semiconductor material, a group III-V semiconductor material, and a group II-VI semiconductor material. The group IV semiconductor material may include, for example, silicon (Si), germanium (Ge), or silicon-germanium (SiGe). The group III-V semiconductor material may include, for example, gallium arsenide (GaAs), indium phosphorus (InP), gallium phosphorus (GaP), indium arsenic (InAs), indium antimony (InSb), or indium gallium arsenide (InGaAs). The group II-VI semiconductor material may include, for example, zinc telluride (ZnTe) or cadmium sulfide (CdS).

Each transistor may be located in an active region AC of the center portion Wa of the wafer W. A plurality of active regions AC may be defined by, or surrounded by, a device isolation layer 112. The device isolation layer 112 may include an insulation material that fills a device isolation trench 112T. For example, the insulation material may include a silicon oxide, a silicon nitride, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ), or a combination thereof. The insulation material may be formed with a high-density plasma (HDP) process and/or with a spin-on dielectric/spin-on glass (SOG) process; however, example embodiments are not limited thereto. The active region AC may be doped with a P-type impurity such as boron and/or an N-type impurity such as at least one of arsenic or phosphorus. The active region AC may be doped with carbon; however, example embodiments are not limited thereto.

A plurality of gate line trenches 120T may extend in parallel with one another. The gate line trenches 120T may extend in a horizontal direction diagonal to a first horizontal direction (e.g. an X direction) and a second horizontal direction (e.g. a Y direction). The gate line trenches 120T may intersect with the active regions AC and the device isolation layer 112. A portion of a gate line trench 120T may intersect with the active region AC and may be recessed into the wafer W from the top surface of the center portion Wa of the wafer W. The other portion of the gate line trench 120T may intersect with the device isolation layer 112 and may be recessed into the device isolation layer 112 from the top surface of the device isolation layer 112. The bottom of the portion of the gate line trench 120T intersecting with the device isolation layer 112 may be at a level lower than that the bottom of the portion of the gate line trench 120T intersecting with the active region AC.

A gate structure 120 may be disposed inside the gate line trench 120T. The gate structure 120 may include a gate insulation layer 122 on or around or conformal to the gate line trench 120T, a gate electrode 124 on the gate insulation layer 122, and a gate capping layer 126 over the gate electrode 124 and the gate insulation layer 122.

The gate insulation layer 122 may be conformally formed on the inner wall of the gate line trench 120T. The gate insulation layer 122 may include a silicon oxide, a silicon nitride, a silicon oxynitride, a high-k material, or a combination thereof. The high-k material is a material having a dielectric constant higher than that of a silicon oxide and may include, for example, a hafnium oxide (HfO$_2$), a zirconium oxide (ZrO$_2$), an aluminum oxide (Al$_2$O$_3$), a hafnium aluminum oxide (HfAlo$_3$), a tantalum oxide (Ta$_2$O$_3$), a titanium oxide (TiO$_2$), or a combination thereof. The gate insulation layer 122 may be formed with a process such as a thermal oxidation process and/or an in-situ steam generation (ISSG) process; however, example embodiments are not limited thereto.

The gate electrode 124 may be formed to fill the gate line trench 120T from the bottom of the gate insulation layer 122 to a certain height of the gate line trench 120T. The gate electrode 124 may include a work function controlling layer on the gate insulation layer 122 and a buried metal layer on the work function controlling layer. The work function-controlling layer may include a metal, a metal nitride, metal carbide, or a combination thereof. The work function-controlling layer may include, for example, titanium (Ti), titanium nitride (TiN), titanium aluminum nitride (TiAlN), titanium aluminum carbide (TiAlC), titanium aluminum carbonitride (TiAlCN), titanium silicon carbonitride (TiSiCN), tantalum (Ta), tantalum nitride (TaN), tantalum aluminum nitride (TaAlN), tantalum silicon carbonitride (TaSiCN), or a combination thereof. The gate electrode 122 may be formed with a deposition process such as a plasma-enhanced chemical vapor deposition (PECVD) process; however, example embodiments are not limited thereto.

The gate capping layer 126 on the gate electrode 124 may fill the remaining portion of the gate line trench 120T. The gate capping layer 126 may include, for example, a silicon oxide, a silicon nitride, a silicon oxynitride, or a combination thereof. The gate capping layer 126 may be formed with a PECVD process; however, example embodiments are not limited thereto.

A first source/drain region 114A and a second source/drain region 114B may be arranged over the active regions AC at both sides of the gate structure 120. The first source/ drain region 114A and the second source/drain region 114B may be doped with or include an N-type impurity such as at least one of phosphorus or arsenic and/or a P-type impurity such as boron. Either or both of the first source/drain regions 114A and the second source/drain region 114B may include impurities such as carbon; however, example embodiments are not limited thereto. The first source/drain region 114A and the second source/drain region 114B may be doped with or at a higher concentration than an impurity having a conductivity type opposite to that of the impurity the active regions AC are doped with.

The active region AC, the first source/drain region 114A, the second source/drain region 114B, and the gate structure 120 may constitute or correspond to a transistor such as an active transistor for a dynamic random access memory (DRAM) device. A plurality of transistors may be formed at the center portion Wa of the wafer W.

A lower structure LS may be disposed on both the center portion Wa and the edge portion Wb of the wafer W. A portion of the lower structure LS on the center portion Wa of the wafer W may include a bit line structure 130, a capacitor structure contact 150, a landing pad 152, and portions of first to third insulation layers 142, 144, and 146. A portion of the lower structure LS on the edge portion Wb of the wafer W may include portions of the first to third insulation layers 142, 144, and 146. The portion of the lower structure LS on the edge portion Wb of the wafer W may not include one or more of the bit line structure 130, the capacitor structure contact 150, and the landing pad 152. Alternatively or additionally, the edge portion Wb may not include or may only include portions of the gate structure 120. Alternatively or additionally the edge portion Wb may not include or may include only portions of the active region AC.

The bit line structure 130 may be connected to the first source/drain region 114A. The bit line structure 130 may include a bit line contact 132, a bit line 134, a bit line capping layer 136, and a bit line spacer 138. The bit line structure 130 may extend in a direction diagonal to the first horizontal direction (X direction) and the second horizontal direction (Y direction). The bit line structure 130 may be formed with one or more CVD processes such as one or more PECVD processes; however, example embodiments are not limited thereto.

The bit line contact 132 may be connected to the first source/drain region 114A. The bit line contact 132 may include at least one of polysilicon such as doped polysilicon, a metal, or a metal silicide. The bit line 134 may be disposed on the bit line contact 132. The bit line 134 may include a metal. The bit line 134 may include a first conductive pattern and a second conductive pattern on the first conductive pattern. The first conductive pattern may include a doped polysilicon, and the second conductive pattern may include, for example, at least one of tungsten (W), aluminum (Al), copper (Cu), nickel (Ni), or cobalt (Co). The bit line capping layer 136 may be disposed on the bit line 134. The bit line capping layer 136 may include a silicon oxide, a silicon nitride, a silicon oxynitride, or a combination thereof. The bit line spacer 138 may be disposed on sidewalls of the bit line contact 132, the bit line 134, and the bit line capping layer 136. The bit line spacer 138 may include a silicon oxide, a silicon nitride, a silicon oxynitride, or a combination thereof.

Although FIG. 2 shows an example in which the bit line contact 132 is formed where the bottom surface thereof is at the same level as the top surface of the center portion Wa of the wafer W, in some example embodiments, the bottom surface of the bit line contact 132 may be formed at a level lower than that of the top surface of the center portion Wa of the wafer W.

The capacitor structure contact 150 may be connected to the second source/drain region 114B. The capacitor structure contact 150 may include a lower contact pattern, a metal silicide layer, and a upper contact pattern, which are sequentially stacked on the second source/drain region 114B, and a barrier layer surrounding side surfaces and the bottom surface of the upper contact pattern. For example, the lower contact pattern may include a polysilicon, the upper contact pattern may include a metal, and the barrier layer may include a metal nitride.

The landing pad 152 may be disposed on the capacitor structure contact 150. The landing pad 152 may include a metal, a metal nitride, or a combination thereof. For example, the metal may include ruthenium (Ru), Ti, Ta, niobium (Nb), iridium (Jr), molybdenum (Mo), or W. The metal nitride may include, for example, at least one of TiN, TaN, niobium nitride (NbN), molybdenum nitride (MoN), or tungsten nitride (WN).

The first to third insulation layers 142, 144, and 146 may be sequentially stacked on the center portion Wa and on the edge portion Wb of the wafer W. The bit line structure 130 and the capacitor structure contact 150 may penetrate through the first insulation layer 142 and the second insulation layer 144. For example, the first insulation layer 142 and the second insulation layer 144 may surround the bit line structure 130 and the capacitor structure contact 150. The landing pad 152 may penetrate through the third insulation layer 146. In other words, the third insulation layer 146 may surround the landing pad 152. The first to third insulation layers 142, 144, and 146 may include a silicon oxide, a silicon nitride, a low-k material, or a combination thereof.

The low-k material refers to a material having a dielectric constant lower than that of a silicon oxide and may include, for example, flowable oxide (FOX), torene silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutenes (BCB), SILK, polyimide, a porous polymeric material, or a combination thereof.

A capacitor structure CA may be disposed on the portion of the lower structure LS on the center portion Wa of the wafer W and may not be present on the edge portion Wb of the wafer W, and a supporting structure SS may be disposed on the portion of the lower structure LS on the edge portion Wb of the wafer W. The capacitor structure CA may include an etch stop layer 162, an intermediate supporter layer 192, an upper supporter layer 194, a plurality of lower electrodes 181, a dielectric layer 180, and an upper electrode 185. The supporting structure SS may include the etch stop layer 162, a lower mold layer MD1, the intermediate supporter layer 192, an upper mode layer MD2, the upper supporter layer 194, and a hard mask structure HM. For example, the capacitor structure CA and the supporting structure SS may share the etch stop layer 162, the intermediate supporter layer 192, and the upper supporter layer 194. In some example embodiments, the capacitor structure CA may further include the hard mask structure HM. For example, the capacitor structure CA and the supporting structure SS may further share the hard mask structure HM.

The etch stop layer 162 may be disposed on the third insulation layer 146. The etch stop layer 162 may include, for example, silicon boron nitride (SiBN). The intermediate supporter layer 192 may be apart from the etch stop layer 162 in a vertical direction (Z direction). The intermediate supporter layer 192 may include, for example, silicon oxynitride (SiON), SiBN, SiCN, silicon nitride (SiN), or a combination thereof. The upper supporter layer 194 may be apart from the intermediate supporter layer 192 in the vertical direction (Z direction). The upper supporter layer 194 may include, for example, SiON, SiBN, SiCN, SiN, or a combination thereof. The intermediate supporter layer 192 and the upper supporter layer 194 may contact the lower electrode 181 and support the lower electrode 181 in a process of forming the capacitor structure CA. Although the upper supporter layer 194 and the intermediate supporter layer 192 are shown in FIG. 2, the number of supporter layers included in the capacitor structure CA may be less than or greater than 2.

As shown in FIG. 3, a portion of the upper supporter layer 194 on the center portion Wa of the wafer W may include a plurality of holes 194H having a certain pattern. However, a portion of the upper supporter layer 194 on the edge portion Wb of the wafer W may not include a hole, and/or may not include a same number of holes per area as that of the center portion Wa of the wafer W. Similarly, a portion of the intermediate supporter layer 192 on the edge portion Wb of the wafer W may include a plurality of holes having a certain pattern. However, a portion of the intermediate supporter layer 192 on the edge portion Wb of the wafer W may not include a hole, or may not include a same number of holes per area as that of the center portion Wa of the wafer W. Although the holes 194H having an elliptical shape are shown in FIG. 3, at least one of the shape, the orientation, and the arrangement of the holes 194H are not limited thereto, and the holes 194H may have, for example, a rectangular shape, a square shape, a rhombus-like shape, a paralleled-like shape, etc.

The hard mask structure HM may be disposed on the upper supporter layer 194.

Detailed descriptions of the hard mask structure HM will be given later with reference to FIGS. 4A to 4L. In some example embodiments, a silicon nitride layer, a polysilicon layer, and a silicon oxide layer may be further between the upper supporter layer 194 and the hard mask structure HM.

The lower electrode 181 may be located on the landing pad 152 and may penetrate through the etch stop layer 162, the intermediate supporter layer 192, and the upper supporter layer 194. In some example embodiments, the lower electrode 181 may further penetrate through the hard mask structure HM. As shown in FIG. 3, in some example embodiments, the lower electrodes 181 may be 2-dimensionally arranged in a honeycomb-like shape. The top surface of the lower electrode 181 may be at the same level as the top surface of the hard mask structure HM. In some example embodiment, unlike as shown in FIG. 2, the top surface of the lower electrode 181 may be at the same level as the top surface of the upper supporter layer 194.

The lower electrode 181 may include a metal, a metal nitride, or a combination thereof. For example, the metal may include Ti, Ta, Ru, Nb, Jr, Mo, W, Ni, or Co. The metal nitride may include, for example, TiN, titanium silicon nitride (TiSiN), TiAlN, TaN, tantalum silicon nitride (TaSiN), NbN, MoN, or WN.

The dielectric layer 180 may be disposed on the lower electrode 181. The dielectric layer 180 may be further disposed on the etch stop layer 162, the intermediate supporter layer 192, and the upper supporter layer 194. In some example embodiments, the dielectric layer 180 may further extend onto the hard mask structure HM. In some example embodiments, the dielectric layer 180 may further extend onto a side surface of the lower mold layer MD1 and a side surface of the upper mode layer MD2. The dielectric layer 180 may include a high-k material. The high-k material may include, for example, $HfO_2$, $ZrO_2$, $Al_2O_3$, $HfAlO_3$, $Ta_2O_3$, $TiO_2$, niobium oxide ($NbO_2$), or a combination thereof.

The upper electrode 185 may be disposed on the dielectric layer 180. The upper electrode 185 may include a metal, a metal nitride, or a combination thereof. The metal may include, for example, Ru, Ti, Ta, Nb, Jr, Mo, or W. The metal nitride may include TiN, TaN, NbN, MoN, or WN.

The lower mold layer MD1 may be disposed between the etch stop layer 162 and the intermediate supporter layer 192. The lower mold layer MD1 may include a silicon oxide, BPSG, or a combination thereof. The upper mold layer MD2 may be between the intermediate supporter layer 192 and the upper supporter layer 194. The upper mold layer MD2 may include a silicon oxide. During a process of forming the capacitor structure CA, the supporting structure SS may support the intermediate supporter layer 192 and the upper supporter layer 194, thereby supporting the lower electrode 181. In some embodiments, side surfaces of the lower mold layer MD1 may not be parallel to side surfaces of the upper mold layer MD2. In some embodiments, the area of the top surface of the lower mold layer MD1 may be greater than the area of the bottom surface of the lower mold layer MD1. In some example embodiments, the bottom surface of the upper mold layer MD2 may have the same size as the top surface of the upper mold layer MD2.

Although FIGS. 1-3 illustrate some components included in the center portion Wa and some components included in the edge portion Wb, example embodiments are not limited to those described with reference to FIGS. 1-3. For example, the edge portion Wb may include a subset of, such as only a portion of, the components and/or features included in the center portion Wa. Furthermore, the edge portion Wb may include a first portion including some components of the center portion Wa, and may include a second porting including some other components and/or more components of the center portion Wb.

Figure 5:
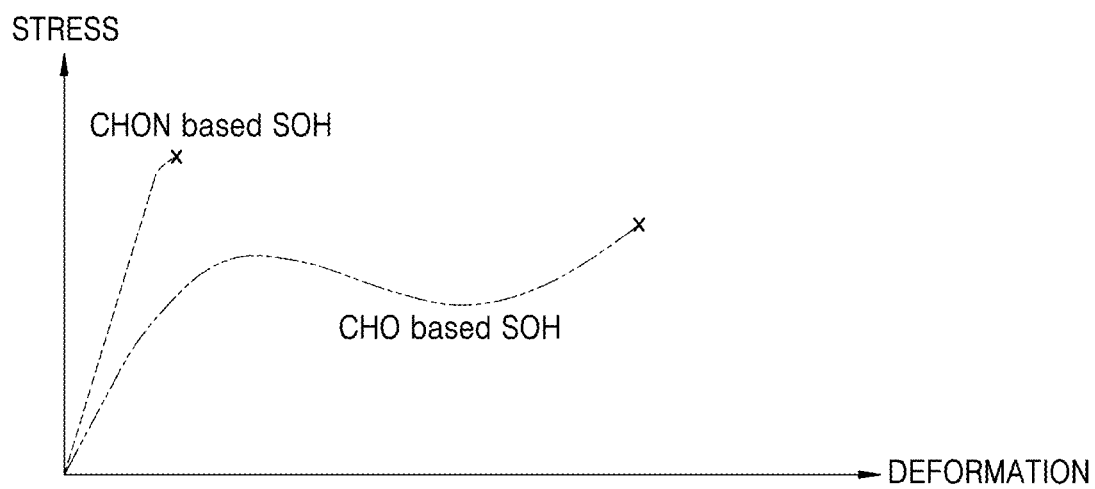
FIG. 5 is a deformation-stress graph of organic materials included in a hard mask structure.
Figure 6:
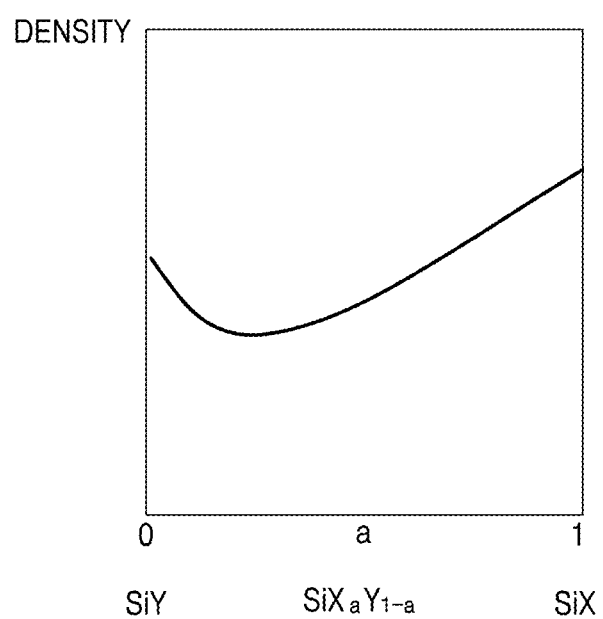
FIG. 6 is a content-density graph of inorganic materials included in a hard mask structure.

FIGS. 4A to 4L are cross-sectional views of hard mask structures HMa to HM1 included in a semiconductor device according to some example embodiments of inventive concepts. FIG. 5 is a deformation-stress graph of organic materials included in a hard mask structure. FIG. 6 is a content-density graph of inorganic materials included in a hard mask structure. The hard mask structure HM shown in FIG. 2 may be any one of the hard mask structures HMa to HM1 shown in FIGS. 4A to 4L.

Figure 4A:
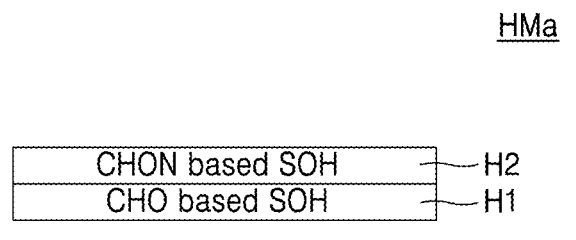

Referring to FIGS. 4A and 5, the hard mask structure HMa may include a first hard mask layer H1 and a second hard mask layer H2 on the first hard mask layer H1. In some example embodiments, the first hard mask layer H1 may include a spin-on hard mask (SOH) layer containing carbon (C), hydrogen (H), and oxygen (O), and the second hard mask layer H2 may include an SOH layer containing C, H, O, and nitrogen (N).

In some example embodiments, the first hard mask layer H1 may not include nitrogen. In some example embodiments, the first hard mask layer H1 may be the same as the second hard mask layer H2, except that the first hard mask layer H1 does not include nitrogen or includes a trace amount of nitrogen.

In the SOH layer containing C, H, O, and N, the content of N may be from about 1 atomic % to about 5 atomic %. In the SOH layer containing C, H, O, and N, the content of elements other than C, H, O, and N may be less than about 1 atomic %. In the SOH layer containing C, H, and O, the content of elements other than C, H, and O may be less than about 1 atomic %. In some example embodiments, the sum of the thickness of the first hard mask layer H1 and the thickness of the second hard mask layer H2 may be from about 50 nm to about 100 nm.

As shown in FIG. 5, the SOH layer containing C, H, and O may be ductile, whereas the SOH layer containing C, H, O, and N may be brittle. Alternatively or additionally, the toughness of the SOH layer containing C, H, and O may be greater than the toughness of the SOH layer containing C, H, O, and N.

The toughness of the SOH layers may be measured using an appropriate analytical technique, such as but not limited to plasticity measurements and/or scratch adhesion techniques and may be stress-based and/or energy based; however, example embodiments are not limited thereto. The toughness of the SOH layers may measure at least one of bending, buckling, indentation, scratching, or tensile stress of the SOH layers; however, example embodiments are not limited thereto.

Therefore, as the SOH layer containing C, H, and O, which is relatively strong against thermal deformation, and the SOH layer containing C, H, O, and N, which is relatively weak against thermal deformation, are used together, destruction due to thermal deformation of the hard mask structure HMa may be reduced as compared to the case of using only the SOH layer containing C, H, O, and N and not using the SOH that does not contain nitrogen.

Alternatively or additionally, the etch selectivity of the SOH layer containing C, H, O, and N may be higher than the etch selectivity of the SOH layer containing C, H, and O. Therefore, as the SOH layer containing C, H, O, and N having a relatively high etch selectivity and the SOH layer containing C, H, and O having a relatively low etch selectivity are used together, an etch selectivity higher than that of the case of using only the SOH layer containing C, H, and O may be achieved.

Figure 4B:
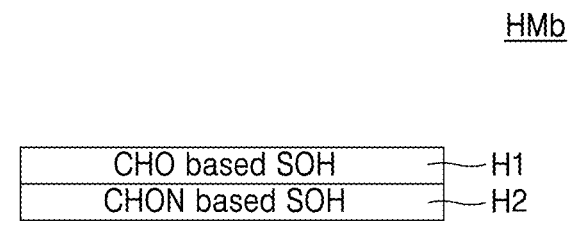

Referring to FIG. 4B, the hard mask structure HMb may include the second hard mask layer H2 and the first hard mask layer H1 on the second hard mask layer H2. In some example embodiments, the first hard mask layer H1 may include an SOH layer containing C, H, and O and may not include nitrogen or may include a trace amount of nitrogen, and the second hard mask layer H2 may include an SOH layer containing C, H, O, and N.

Referring to FIG. 4C, the hard mask structure HMc may include first hard mask layers H1 and second hard mask layers H2 that are alternately stacked. Although FIG. 4C shows that the hard mask structure HMc includes three first hard mask layers H1 and three second hard mask layers H2, the hard mask structure HMc may include less than or more than three first hard mask layers H1 and less than or more than three second hard mask layers H2.

In some example embodiments, the first hard mask layer H1 may include an SOH layer containing C, H, and O and not include nitrogen, and the second hard mask layer H2 may include an SOH layer containing C, H, O, and N. Opposite to the structure shown in FIG. 4C, the first hard mask layer H1 may include an SOH layer containing C, H, O, and N, and the second hard mask layer H2 may include an SOH layer containing C, H, and O and not containing nitrogen. In some example embodiments, the sum of the combined thicknesses of all of the first hard mask layers H1 and the combined thicknesses of all of the second hard mask layers H2 may be from about 50 nm to about 100 nm.

Figure 4D:
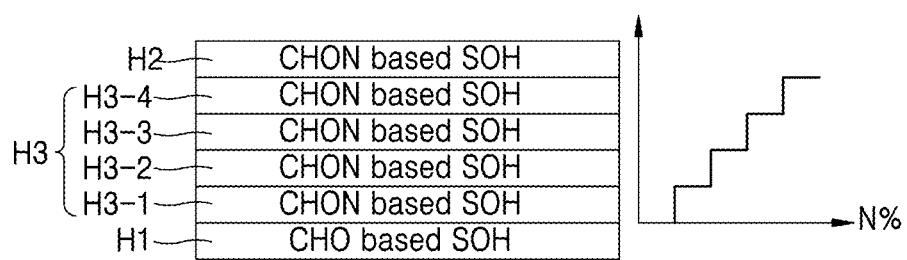

Referring to FIG. 4D, the hard mask structure HMd may include the first hard mask layer H1, the second hard mask layer H2 above the first hard mask layer H1, and a third hard mask layer H3 between the first hard mask layer H1 and the second hard mask layer H2. The sum of the thickness of the first hard mask layer H1, the thickness of the second hard mask layer H2, and the thickness of the third hard mask layer H3 may be from about 50 nm to about 100 nm.

The first hard mask layer H1 may include an SOH layer containing C, H, and O, and not including nitrogen and the second hard mask layer H2 may include an SOH layer containing C, H, O, and N.

The third hard mask layer H3 may include a plurality of sub layers, for example, first to fourth sub layers H3-1 to H3-4. The first sub layer H3-1 may be disposed on the first hard mask layer H1 and may include an SOH layer containing C, H, O, and N. The second sub layer H3-2 may be disposed on the first sub layer H3-1 and may include an SOH layer containing C, H, O, and N. The third sub layer H3-3 may be disposed on the second sub layer H3-2 and may include an SOH layer containing C, H, O, and N. The fourth sub layer H3-4 may be disposed on the third sub layer H3-3 and may include an SOH layer containing C, H, O, and N.

The contents of N in the first to fourth sub layers H3-1 to H3-4 may increase, e.g. increase in a step-wise manner, in a direction (e.g. a Z direction) toward the second hard mask layer H2. For example, the content of N in the second sub layer H3-2 may be higher than the content of N in the first sub layer H3-1, the content of N in the third sub layer H3-3 may be higher than the content of N in the second sub layer H3-2, and the content of N in the fourth sub layer H3-4 may be higher than the content of N in third sub layer H3-3. In other words, the contents of N in the first to fourth sub layers H3-1 to H3-4 may decrease in a direction toward the first hard mask layer H1. For example, the content of N in the first sub layer H3-1 may be lower than the content of N in the second sub layer H3-2, the content of N in the second sub layer H3-2 may be lower than the content of N in the third sub layer H3-3, and the content of N in the third sub layer H3-3 may be lower than the content of N in the fourth sub layer H3-4. Although FIG. 4D illustrates that the content of nitrogen in each sub layers H3-1 to H3-4 increases by a same amount, example embodiments are not limited thereto. For example, a content of nitrogen in sub-layers may increase in a non-linear amount.

Figure 4E:
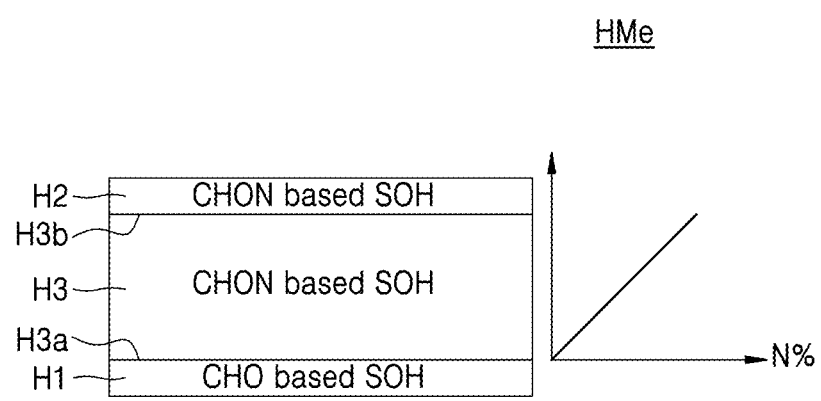

Referring to FIG. 4E, the hard mask structure HMe may include the first hard mask layer H1, the second hard mask layer H2 above the first hard mask layer H1, and the third hard mask layer H3 between the first hard mask layer H1 and the second hard mask layer H2.

The first hard mask layer H1 may include an SOH layer containing C, H, and O, and no nitrogen, while the second hard mask layer H2 may include an SOH layer containing C, H, O, and N.

The third hard mask layer H3 may include an SOH layer containing C, H, O, and N, wherein the content of N in the third hard mask layer H3 may vary. For example, the content of N in the third hard mask layer H3 may continuously increase from a surface H3$a$ contacting the first hard mask layer H1 to a surface H3$b$ contacting the second hard mask layer H2. Although FIG. 4E shows that the content of N in the third hard mask layer H3 increases linearly, the graph is merely an example, and inventive concepts are not limited thereto. For example, the content of N in the third hard mask layer H3 may increase non-linearly.

Figure 4F:
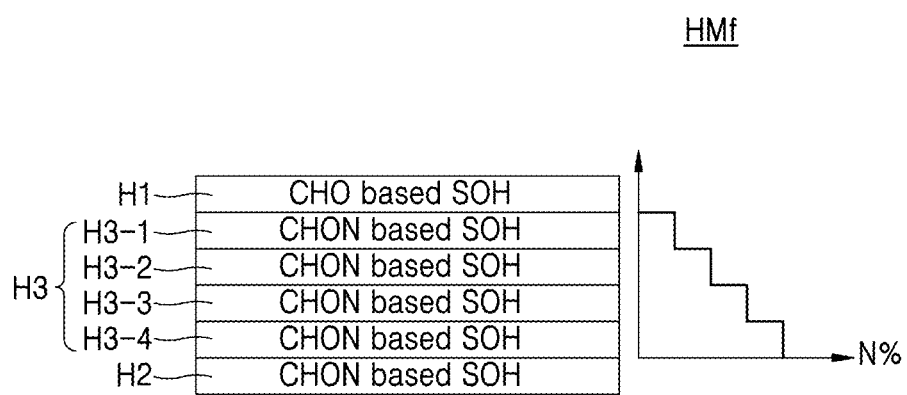

Referring to FIG. 4F, the hard mask structure HMf may include the second hard mask layer H2, the first hard mask layer H1 above the second hard mask layer H2, and the third hard mask layer H3 between the first hard mask layer H1 and the second hard mask layer H2.

The first hard mask layer H1 may include an SOH layer containing C, H, and O and no nitrogen, and the second hard mask layer H2 may include an SOH layer containing C, H, O, and N.

The third hard mask layer H3 may include a plurality of sub layers, for example, the first to fourth sub layers H3-1 to H3-4. The fourth sub layer H3-4 may be disposed on the first hard mask layer H1 and may include an SOH layer containing C, H, O, and N. The third sub layer H3-3 may be disposed on the fourth sub layer H3-4 and may include an SOH layer containing C, H, O, and N. The second sub layer H3-2 may be disposed on the third sub layer H3-3 and may include an SOH layer containing C, H, O, and N. The first sub layer H3-1 may be disposed on the second sub layer H3-2 and may include an SOH layer containing C, H, O, and N.

The contents of N in the first to fourth sub layers H3-1 to H3-4 may increase in a direction toward the second hard mask layer H2, e.g. in a negative-Z direction. For example, the content of N in the second sub layer H3-2 may be higher than the content of N in the first sub layer H3-1, the content of N in the third sub layer H3-3 may be higher than the content of N in the second sub layer H3-2, and the content of N in the fourth sub layer H3-4 may be higher than the content of N in third sub layer H3-3. In other words, the contents of N in the first to fourth sub layers H3-1 to H3-4 may decrease in a direction toward the first hard mask layer H1. In other words, the content of N in the first sub layer H3-1 may be lower than the content of N in the second sub layer H3-2, the content of N in the second sub layer H3-2 may be lower than the content of N in the third sub layer H3-3, and the content of N in the third sub layer H3-3 may be lower than the content of N in the fourth sub layer H3-4. Although FIG. 4F illustrates that the content of nitrogen in each sub layers H3-1 to H3-4 increases by a same amount, example embodiments are not limited thereto. For example, a content of nitrogen in sub-layers may increase in a non-linear amount.

Figure 4G:
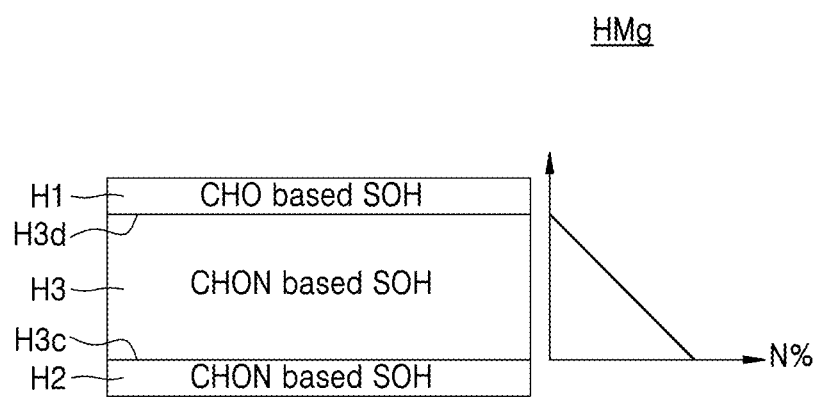

Referring to FIG. 4G, the hard mask structure HMg may include the second hard mask layer H2, the first hard mask layer H1 above the second hard mask layer H2, and the third hard mask layer H3 between the second hard mask layer H2 and the first hard mask layer H1.

The second hard mask layer H2 may include an SOH layer containing C, H, O, and N, and the first hard mask layer H1 may include an SOH layer containing C, H, and O and not containing nitrogen.

The third hard mask layer H3 may include an SOH layer containing C, H, O, and N, wherein the content of N in the third hard mask layer H3 may vary. For example, the content of N in the third hard mask layer H3 may continuously decrease from a surface H3c contacting the second hard mask layer H2 to a surface H3d contacting the first hard mask layer H1. Although FIG. 4G shows that the content of N in the third hard mask layer H3 decreases linearly, the graph is merely an example, and inventive concepts are not limited thereto. For example, the content of N in the third hard mask layer H3 may decrease non-linearly.

Figure 4H:
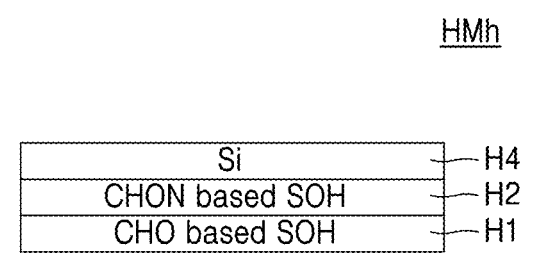

Referring to FIG. 4H, the hard mask structure HMh may include the first hard mask layer H1, the second hard mask layer H2 on the first hard mask layer H1, and a fourth hard mask layer H4 on the second hard mask layer H2.

One of the first hard mask layer H1 and the second hard mask layer H2 may include an SOH layer containing C, H, and O and not including nitrogen, and the other one of the first hard mask layer H1 and the second hard mask layer H2 may include an SOH layer containing C, H, O, and N. The fourth hard mask layer H4 may include Si such as polysilicon. In some example embodiments, the sum of the thickness of the first hard mask layer H1 and the thickness of the second hard mask layer H2 may be from about 50 nm to about 100 nm, and the thickness of the fourth hard mask layer H4 may be from about 10 nm to about 30 nm.

Referring to FIG. 4I, the hard mask structure HMh may include the first hard mask layer H1, the second hard mask layer H2 on the first hard mask layer H1, and a fourth hard mask layer H4i on the second hard mask layer H2.

One of the first hard mask layer H1 and the second hard mask layer H2 may include an SOH layer containing C, H, and O and not containing nitrogen, and the other one of the first hard mask layer H1 and the second hard mask layer H2 may include an SOH layer containing C, H, O, and N. The fourth hard mask layer H4i may include Si and an element X. Here, the element X may include or be selected from the group including boron (B), C, N, 0, or phosphorus (P).

Referring to FIGS. 4J and 6, the hard mask structure HMj may include the first hard mask layer H1, the second hard mask layer H2 on the first hard mask layer H1, and a fourth hard mask layer H4j on the second hard mask layer H2.

One of the first hard mask layer H1 and the second hard mask layer H2 may include an SOH layer containing C, H, and O and not containing nitrogen, and the other one of the first hard mask layer H1 and the second hard mask layer H2 may include an SOH layer containing C, H, O, and N. The fourth hard mask layer H4j may include Si, an element X, and an element Y. Here, the element X and the element Y may each include or be selected from the group including B, C, N, O, or P, wherein the element X and the element Y may be different from each other.

As shown in FIG. 6, the density of a layer including Si, the element X, and the element Y may be lower than the density of a layer including Si and the element X only or the density of a layer including Si and the element Y only. A reason therefor may be that the layer including Si, the element X, and the element Y is a porous layer. A porous layer including Si, the element X, and the element Y may help outgassing/discharge gases, such as different process gases that are generated during a process of baking or annealing or heat-treating the hard mask structure HMj to the outside of the hard mask structure HMj. Therefore, stress such as tensile and/or compressive stress due to gases generated during a baking process may be reduced.

Figure 4K:
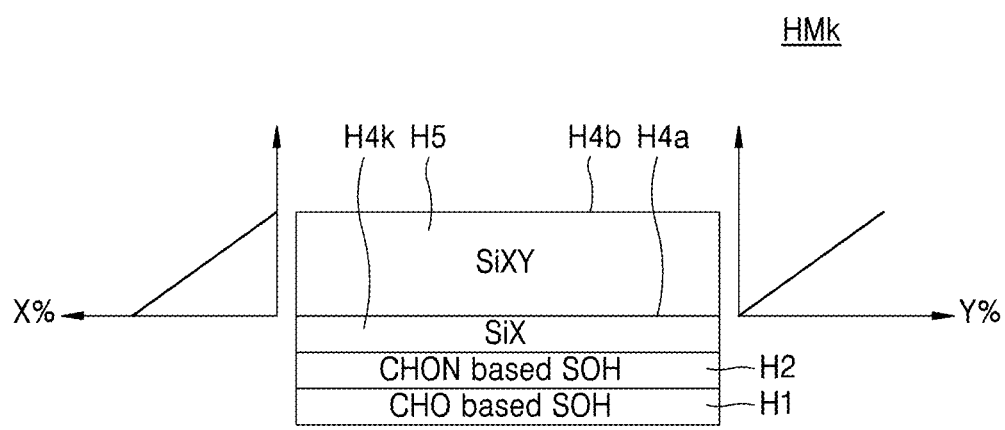

Referring to FIG. 4K, the hard mask structure HMk may include the first hard mask layer H1, the second hard mask layer H2 on the first hard mask layer H1, a fourth hard mask layer H4k on the second hard mask layer H2, and a fifth hard mask layer H5 on the fourth hard mask layer H4k.

One of the first hard mask layer H1 and the second hard mask layer H2 may include an SOH layer containing C, H, and O and not containing nitrogen, and the other one of the first hard mask layer H1 and the second hard mask layer H2 may include an SOH layer containing C, H, O, and N. The fourth hard mask layer H4k may include Si and an element X. Here, the element X may include or be selected from the group including B, C, N, O, or P.

The fifth hard mask layer H5 may include Si, the element X, and an element Y. The content of the element X and the content of the element Y in the fifth hard mask layer H5 may vary. For example, the content of the element X in the fifth hard mask layer H5 may continuously and/or discontinuously and/or step-wisely decrease from a surface H4a contacting the fourth hard mask layer H4k to a surface H4b opposite to the surface H4a. Although FIG. 4K shows that the content of the element X in the fifth hard mask layer H5 decreases linearly, the graph is merely an example, and inventive concepts are not limited thereto. For example, the content of the element X in the fifth hard mask layer H5 may decrease non-linearly. Alternatively or additionally, the content of the element Y in the fifth hard mask layer H5 may continuously and/or discontinuously and/or step-wisely increase from the surface H4a contacting the fourth hard mask layer H4k to the surface H4b opposite to the surface H4a. Although FIG. 4K shows that the content of the element Y in the fifth hard mask layer H5 increases linearly, the graph is merely an example, and inventive concepts are not limited thereto. For example, the content of the element Y in the fifth hard mask layer H5 may increase non-linearly.

Figure 4L:
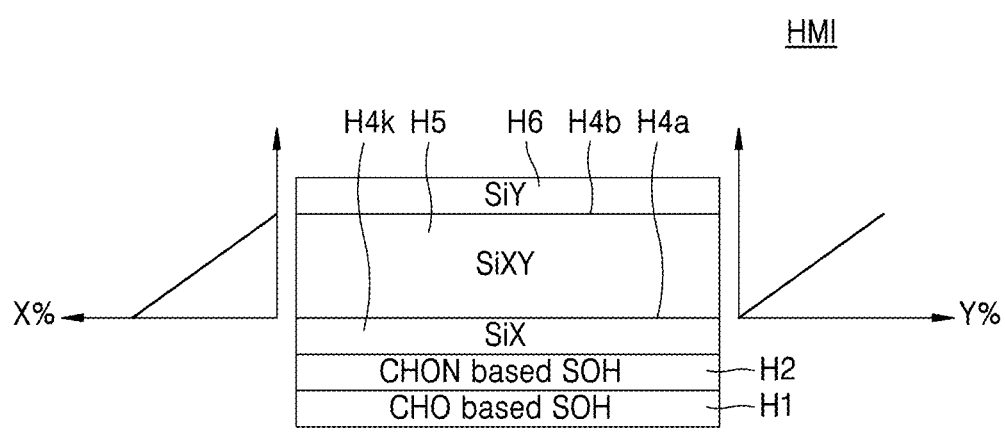

Referring to FIG. 4L, compared to the hard mask structure HMk of FIG. 4K, the hard mask structure HM1 may further include a sixth hard mask layer H6 on the fifth hard mask layer H5. The sixth hard mask layer H6 may include Si and an element Y.

FIGS. 7A to 7H are cross-sectional diagrams showing a method of manufacturing or fabricating a semiconductor device according to some example embodiments of inventive concepts.

Figure 7A:
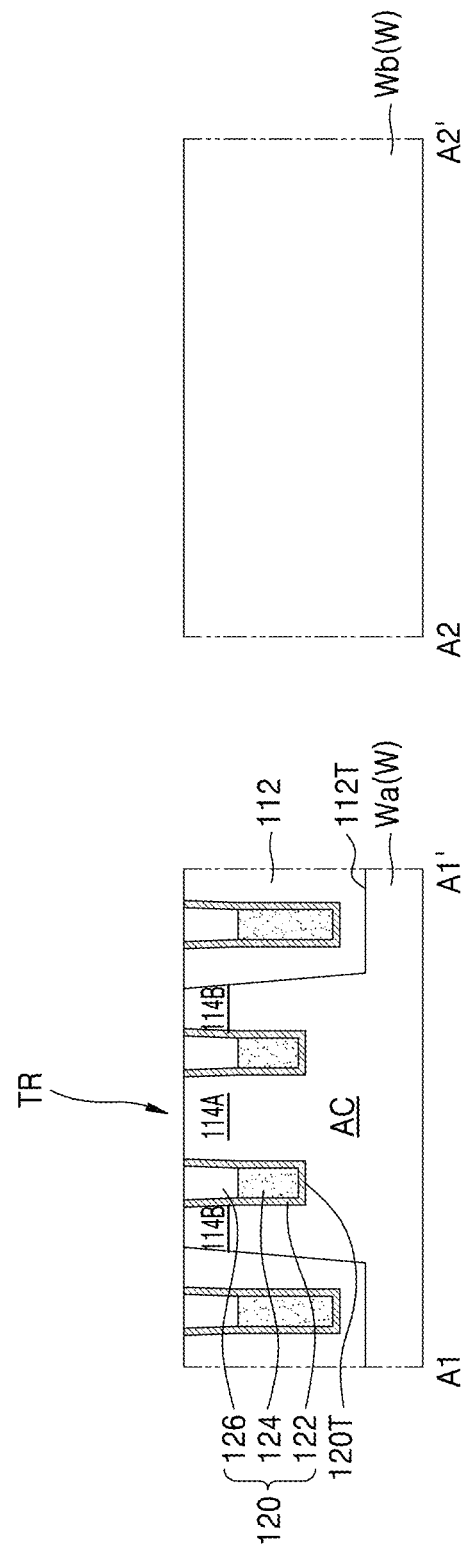
FIGS. 7A to 7H are cross-sectional diagrams showing a method of manufacturing a semiconductor device according to some example embodiments of inventive concepts.

Referring to FIG. 7A, a plurality of transistors TR are formed at a non-edge portion, e.g. the center portion Wa of the wafer W. The plurality of transistors TR may not be formed, or may only be partially formed, in the edge portion Wb of the wafer. First, the device isolation trench 112T defining the active regions AC is formed at the center portion Wa of the wafer W, and the device isolation layer 112 may be formed in the device isolation trench 112T, e.g. formed with an STI process and/or an HDP deposition process and/or a spin-on glass process. Next, the gate line trench 120T intersecting with the active regions AC and the gate line trench 120T intersecting with the device isolation layer 112 may be formed at the center portion Wa of the wafer W. Due to a difference between the etching speed of the wafer W and the device isolation layer 112, the bottom of the gate line trench 120T intersecting with the active regions AC may be formed at a level higher than that of the bottom of the gate line trench 120T intersecting with the device isolation layer 112.

A plurality of gate structures 120 may be formed in a plurality of gate line trenches 120T, respectively, e.g. within the center portion Wa but not within the edge portion Wb. For example, the gate insulation layer 122 is formed on each of the gate line trenches 120T. The gate electrode 124 filling the remaining portion of the gate line trench 120T is formed on the gate insulation layer 122. Next, the gate electrode 124 may be removed through an etch-back process and/or a chemical mechanical planarization (CMP) process. Next, the gate capping layer 126 is formed on the gate electrode 124 to fill the remaining portion of the gate line trench 120T. Finally, the gate capping layer 126 may be planarized with an etch-back process and/or a CMP process.

The first source/drain region 114A and the second source/drain region 114B may be formed by doping/implanting impurity ions on the upper portions of the active regions AC at both sides of the gate structure 120. In some example embodiments, after the device isolation layer 112 is formed before the gate structure 120 is formed, the first source/drain region 114A and the second source/drain region 114B may be formed by implanting impurity ions on the upper portions of the active regions AC. Either or both of the first source/drain region 114A and the second source/drain region 114B may not be formed in the edge portion Wb.

Figure 7B:
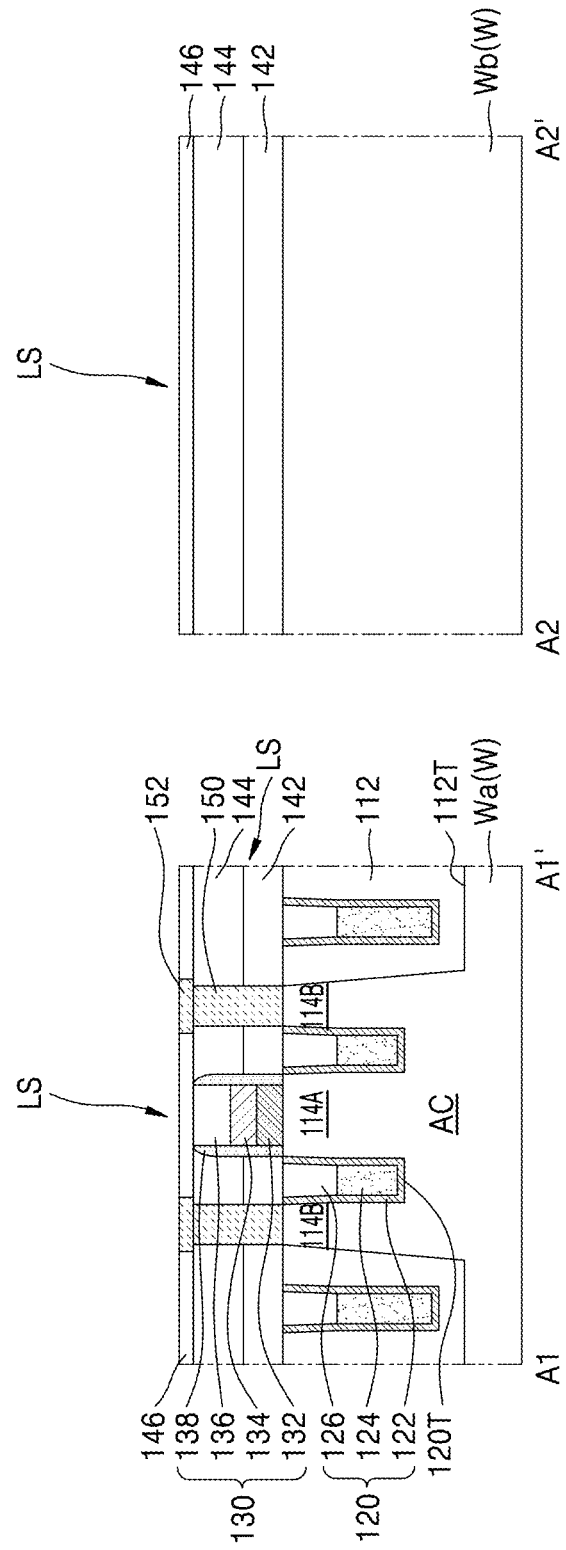

Referring to FIG. 7B, the lower structure LS may be formed on the center portion Wa and the edge portion Wb of the wafer W. First, the bit line structure 130 may be formed on the first source/drain region 114A. For example, the bit line contact 132 may be formed on the first source/drain region 114A, the bit line 134 may be formed on the bit line contact 132, and the bit line capping layer 136 may be formed on the bit line 134. Also, the bit line spacer 138 is formed on sidewalls of the bit line contact 132, the bit line 134, and the bit line capping layer 136. The bit line structure 130 may not be formed, or may be only partially formed, on the edge portion Wb.

Additionally, the first insulation layer 142 surrounding the bit line structure 130 is formed at the center portion Wa and the edge portion Wb of the wafer W. Additionally, the second insulation layer 144 surrounding the bit line structure 130 may be formed on the first insulation layer 142.

Next, the capacitor structure contact 150 that penetrates through the first insulation layer 142 and the second insulation layer 144 and contacts the second source/drain region 114B may be formed, e.g. may be formed in the center portion Wa but may not be formed or may only partially be formed in the edge portion Wb. Next, the third insulation layer 146 may be formed on the capacitor structure contact 150 and the second insulation layer 144, e.g. in both the center portion Wa and the edge portion Wb. Next, the landing pad 152 that penetrates through the third insulation layer 146 and contacts the capacitor structure contact 150 may be formed in the center portion Wa, and may not be formed in the edge portion Wb.

Figure 7C:
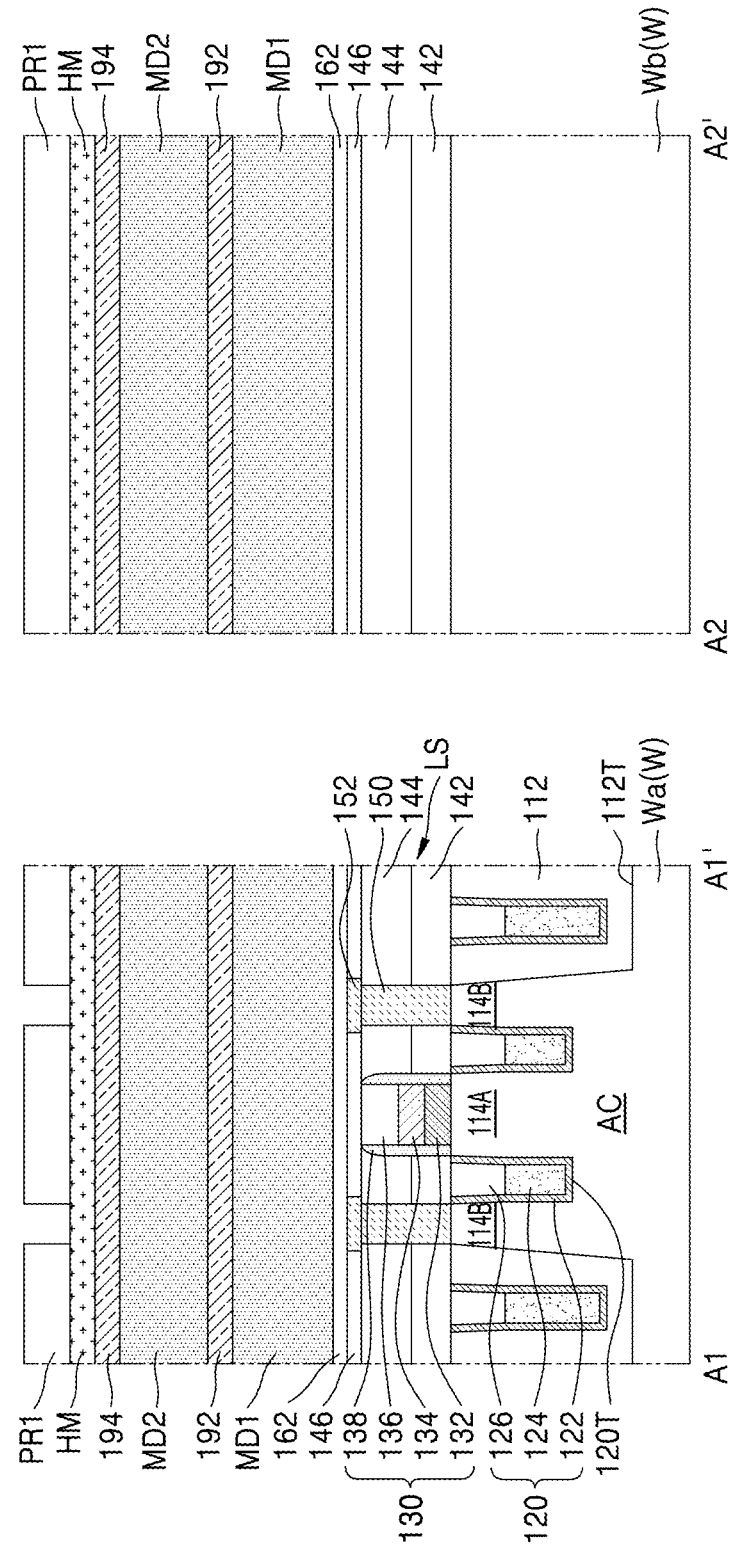

Referring to FIG. 7C, the etch stop layer 162, the lower mold layer MD1, the intermediate supporter layer 192, the upper mold layer MD2, the upper supporter layer 194, the hard mask structure HM, and a photoresist pattern PR1 are sequentially formed on the landing pad 152 and the third insulation layer 146, in both the center portion Wa and the edge portion Wb. A method of forming the hard mask structure HM will be described below in detail with reference to FIGS. 4A to 4L. The hard mask structure HM of FIG. 7C may be any one of the hard mask structures HMa to HM1 shown in FIGS. 4A to 4L.

Referring to FIG. 4A, the first hard mask layer H1 is formed first through spin coating, and then the first hard mask layer H1 is baked with a first baking. Next, the second hard mask layer H2 is formed on the first hard mask layer H1 through spin coating, and then the second hard mask layer H2 is baked with a second baking. Therefore, the hard mask structure HMa may be formed. A baking temperature may be from about 300° C. to about 500° C., and may be the same or may be different between the first baking and the second baking. Although thermal stress may occur during a baking process, the second hard mask layer H2 including an SOH layer containing C, H, O, and N is relatively strong against thermal stress, and thus, the hard mask structure HMa may not be destroyed or may be less likely to be destroyed.

Referring to FIG. 4B, the second hard mask layer H2 is formed first through spin coating, and then the second hard mask layer H2 is baked in a first baking. Next, the first hard mask layer H1 is formed on the second hard mask layer H2 through spin coating, and then the first hard mask layer H1 is baked in a second baking. Therefore, the hard mask structure HMb may be formed.

Referring to FIG. 4C, the hard mask structure HMc may be performed by alternately repeating an operation of spin coating and baking the first hard mask layer H1 and an operation of spin coating and baking the second hard mask layer H2.

Referring to FIG. 4D, the first hard mask layer H1 is spin coated and baked in a first baking. Next, the third hard mask layer H3 is formed by repeating an operation of spin coating and second baking a sub layer, that is, the first sub layer H3-1, the second sub layer H3-2, the third sub layer H3-3, or the fourth sub layer H3-4. Finally, the second hard mask layer H2 is spin coated and baked in a third baking on the third hard mask layer H3. Therefore, the hard mask structure HMd may be formed.

Referring to FIGS. 4D and 4E, the first hard mask layer H1 is spin coated and baked in a first baking. Next, an operation of spin coating and baking a sub layer, for example, the first sub layer H3-1, the second sub layer H3-2, the third sub layer H3-3, or the fourth sub layer H3-4, is repeated. Next, the second hard mask layer H2 is spin coated and baked with a third baking on the third hard mask layer H3. Meanwhile, the first to fourth sub layers H3-1 to H3-4 may be transformed into the third hard mask layer H3 by diffusing N in the first to fourth sub layers H3-1 to H3-4. In some example embodiments, an operation of diffusing N may be performed simultaneously as a baking operation and/or a spin coating operation.

Referring to FIG. 4F, the second hard mask layer H2 is spin coated and baked in a first baking. Next, the third hard mask layer H3 is formed by repeating an operation of spin coating and second baking a sub layer, that is, the fourth sub layer H3-4, the third sub layer H3-3, the second sub layer H3-2, or the first sub layer H3-1. Finally, the first hard mask layer H1 is spin coated and baked in a third baking on the third hard mask layer H3. Therefore, the hard mask structure HMf may be formed.

Referring to FIGS. 4F and 4G, the second hard mask layer H2 is spin coated and baked in a first baking. Next, the third hard mask layer H3 is formed by repeating an operation of spin coating and baking a sub layer in a second baking, that is, the fourth sub layer H3-4, the third sub layer H3-3, the second sub layer H3-2, or the first sub layer H3-1. Next, the first hard mask layer H1 is spin coated and baked in a third baking on the third hard mask layer H3. Meanwhile, the first to fourth sub layers H3-1 to H3-4 may be transformed into the third hard mask layer H3 by diffusing N in the first to fourth sub layers H3-1 to H3-4. In some example embodiments, an operation of diffusing N may be performed simultaneously as a baking operation and/or a spin coating operation.

Referring to FIG. 4H, the first hard mask layer H1 is formed first through spin coating, and then the first hard mask layer H1 is baked in a first baking. Next, the second hard mask layer H2 is formed on the first hard mask layer H1 through spin coating, and then the second hard mask layer H2 is baked in a second baking. Next, the fourth hard mask layer H4 may be formed on the second hard mask layer H2, e.g. through plasma enhanced chemical vapor deposition (PECVD). Therefore, the hard mask structure HMh may be formed.

Referring to FIG. 4I, the first hard mask layer H1 is formed first through spin coating, and then the first hard mask layer H1 is baked in a first baking. Next, the second hard mask layer H2 is formed on the first hard mask layer H1 through spin coating, and then the second hard mask layer H2 is baked in a second baking. Next, a fourth hard mask layer H4$g$ may be formed on the second hard mask layer H2, e.g. through PECVD. Therefore, the hard mask structure HMi may be formed.

Referring to FIG. 4J, the first hard mask layer H1 is formed first through spin coating, and then the first hard mask layer H1 is baked in a first baking. Next, the second hard mask layer H2 is formed on the first hard mask layer H1 through spin coating, and then the second hard mask layer H2 is baked in a second baking. Next, a fourth hard mask layer H4$j$ may be formed on the second hard mask layer H2, e.g. through PECVD. Therefore, the hard mask structure HMj may be formed.

The fourth hard mask layer H4$j$ may be formed through a PECVD process by using a first source gas including Si and the element X and a second source gas including Si and the element Y. In some example embodiments, a carrier gas such as at least one of argon (Ar), nitrogen ($N_2$), and helium (He) may be further used.

The fourth hard mask layer H4$j$ including a porous layer including Si, the element X, and the element Y may discharge gases generated during a process of baking the fourth hard mask layer H4$j$ to the outside of the hard mask structure HMj. Therefore, the fourth hard mask layer H4$j$ including a porous layer including Si, the element X, and the element Y may reduce or help to reduce stress due to gases generated during a baking process.

Referring to FIG. 4K, the first hard mask layer H1 is formed first through spin coating, and then the first hard mask layer H1 is baked in a first baking. Next, the second hard mask layer H2 is formed on the first hard mask layer H1 through spin coating, and then the second hard mask layer H2 is baked in a second baking. Next, a fourth hard mask layer H4$k$ may be formed on the second hard mask layer H2, e.g. through PECVD. Next, the fifth hard mask layer H5 may be formed on the fourth hard mask layer H4$k$, e.g. through PECVD.

The fifth hard mask layer H5 may be formed through a PECVD process by using a first source gas including Si and the element X and a second source gas including Si and the element Y. In some example embodiments, a carrier gas such as at least one of Ar, $N_2$, and He may be further used. By continuously or discontinuously or step-wisely reducing a deposition condition, e.g., a ratio between the flux of the second source gas and the flux of the first source gas, as deposition time is elapsed, the content of the element X in the fifth hard mask layer H5 may be reduced, and the content of the element Y in the fifth hard mask layer H5 may be increased.

Referring to FIG. 4L, as described above with reference to FIG. 4K, the first hard mask layer H1, the second hard mask layer H2, the fourth hard mask layer H4$k$, and the fifth hard mask layer H5 are formed. Next, the sixth hard mask layer H6 is formed on the fifth hard mask layer H5, e.g. through PECVD. Therefore, the hard mask structure HM1 may be formed.

Figure 7D:
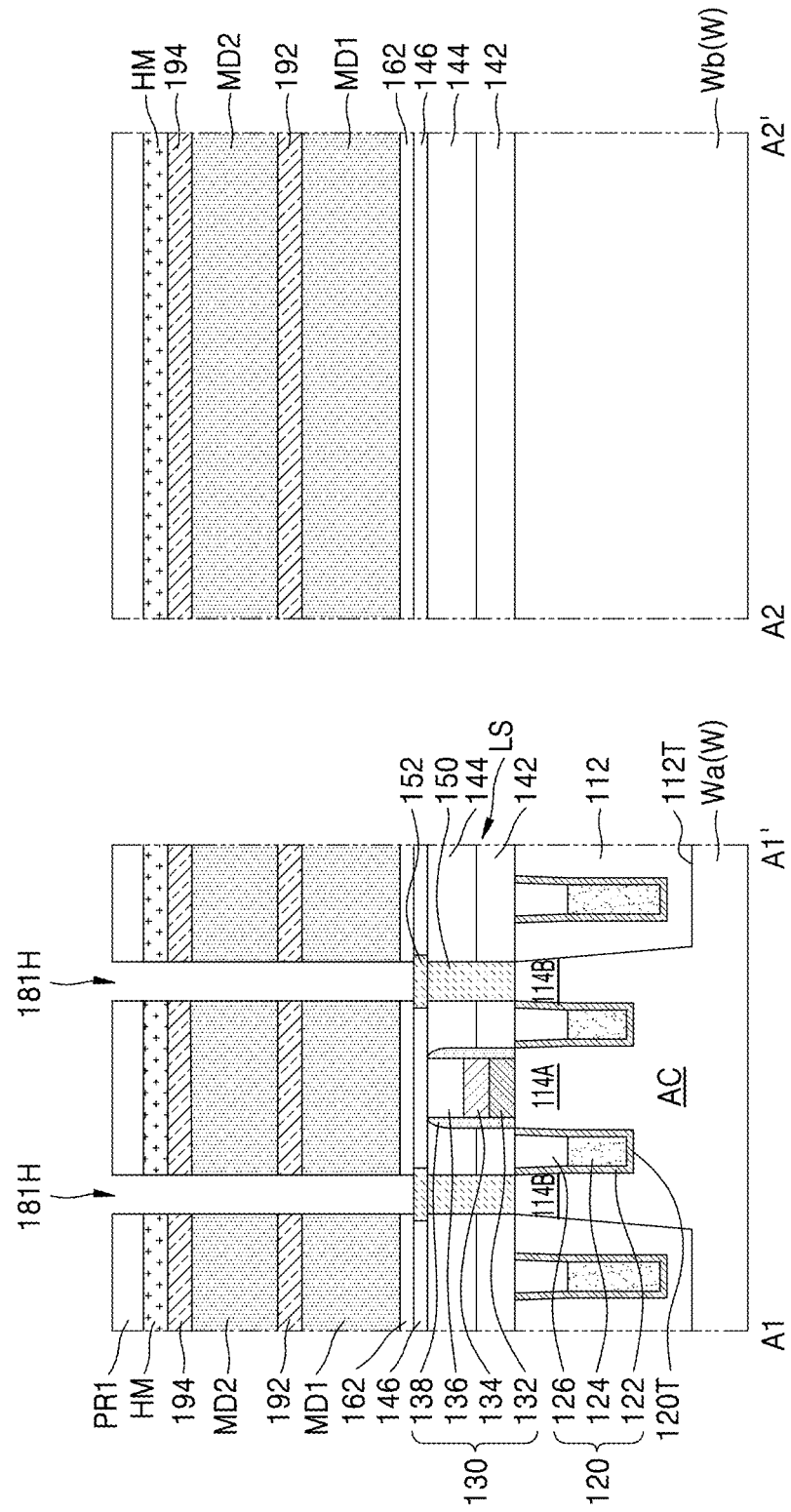

Referring to FIG. 7D, a lower electrode hole 181H penetrating through the hard mask structure HM, the upper supporter layer 194, the upper mold layer MD2, the intermediate supporter layer 192, the lower mold layer MD1, and the etch stop layer 162 may be formed, e.g. in the center portion Wa and not in the edge portion Wb, by using the photoresist pattern PR1 as an etching mask. The lower electrode hole 181H may expose the landing pad 152.

Figure 7E:
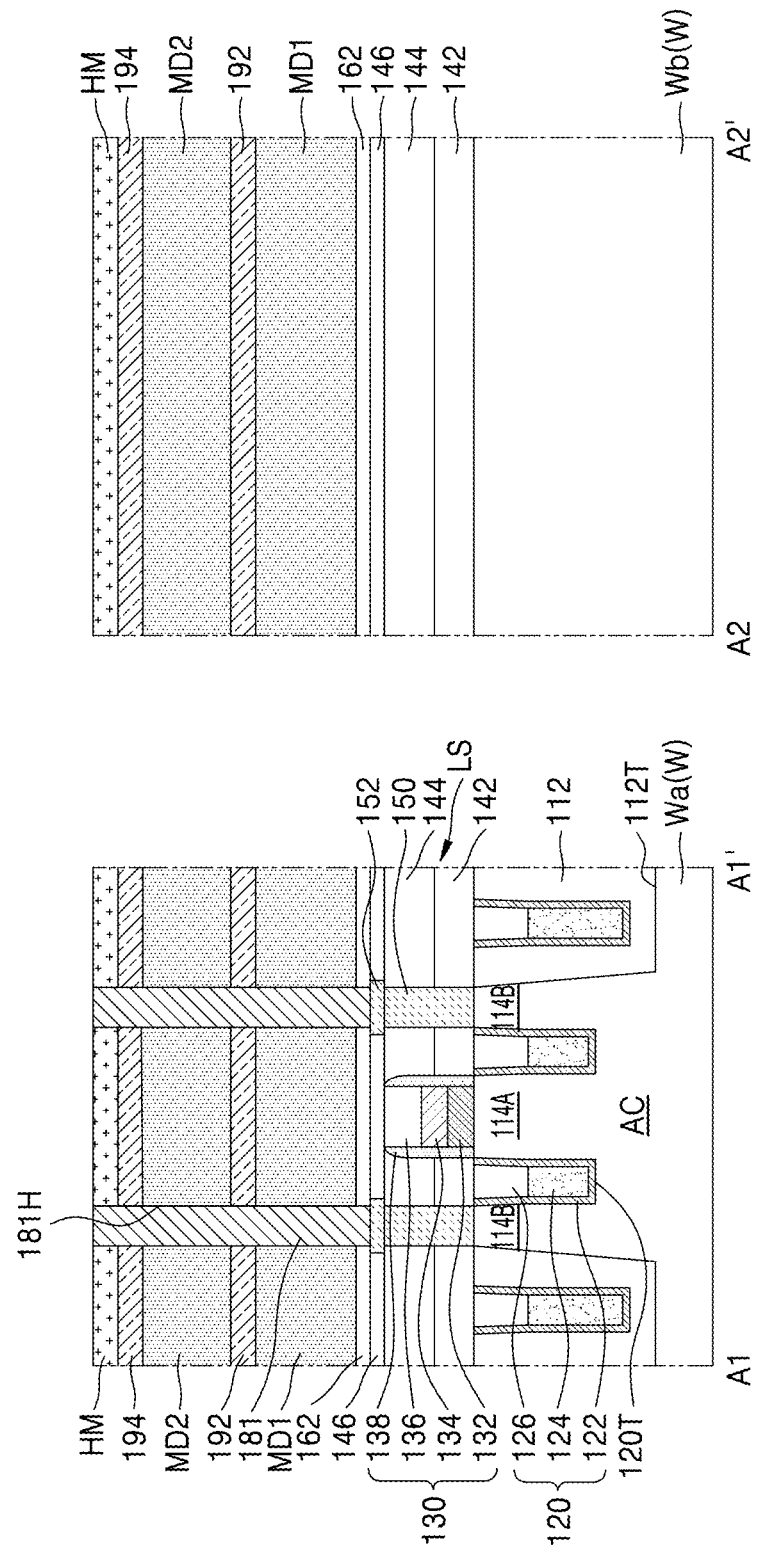

Referring to FIG. 7E, the lower electrode 181 may be formed in the lower electrode hole 181H, e.g. in the center portion Wa and not in the edge portion Wb. For example, a lower electrode layer may be formed on the lower electrode hole 181H and the photoresist pattern PR1 and portions of the photoresist pattern PR1 and the lower electrode layer may be removed to expose the top surface of the hard mask structure HM, thereby forming the lower electrode 181. In some example embodiments, the photoresist pattern PR1 may be removed during the formation of the lower electrode hole 181H of FIG. 7D. In this case, the lower electrode layer may be formed on the lower electrode hole 181H and the hard mask structure HM and the upper portion of the lower electrode layer may be removed to expose the top surface of the hard mask structure HM, thereby forming the lower electrode 181.

Figure 7F:
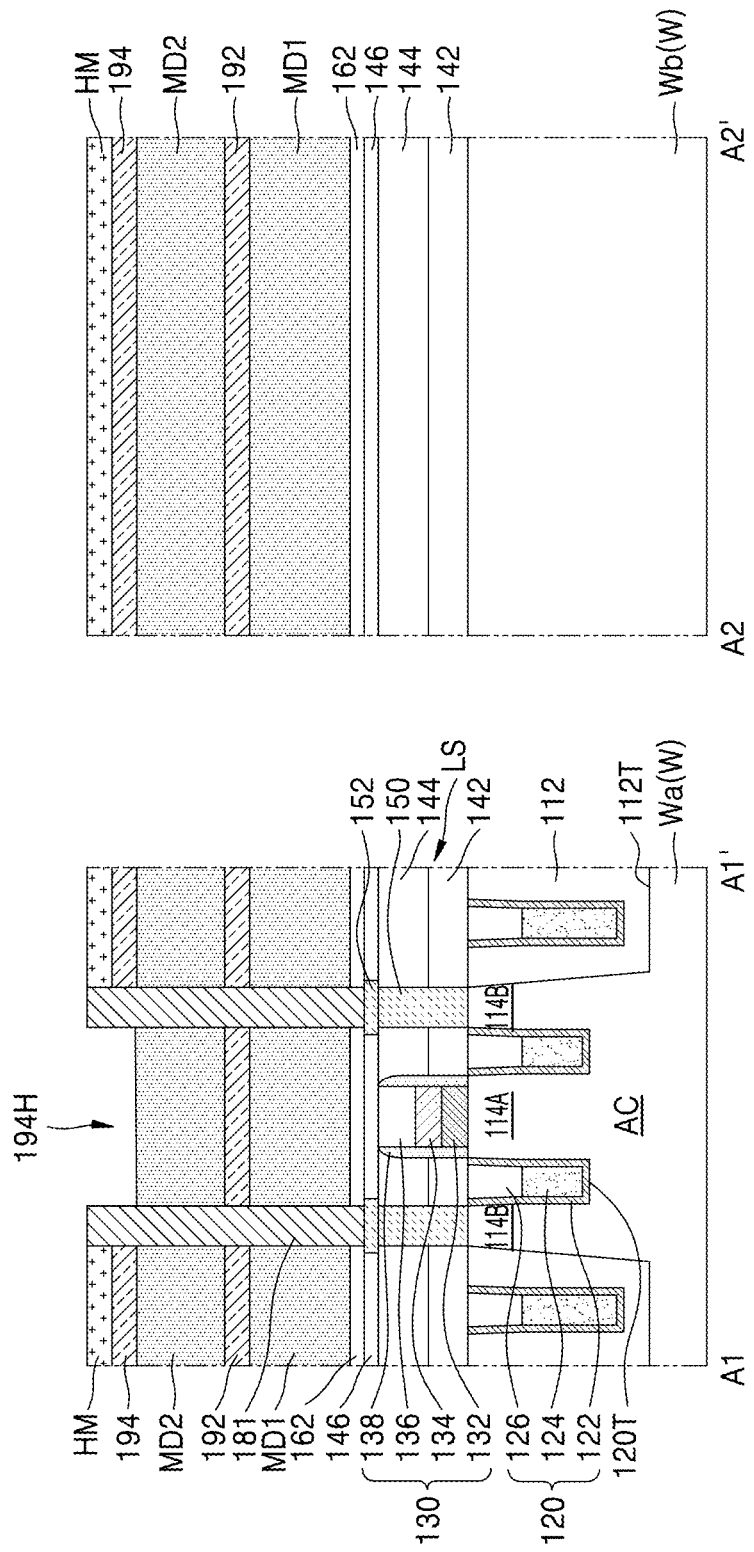

Referring to FIG. 7F, a first hole 194H penetrating through the upper supporter layer 194 and the hard mask structure HM is formed. The first hole 194H may be formed only over the center portion Wa of the wafer W and may not be formed over the edge portion Wb of the wafer W.

Figure 7G:
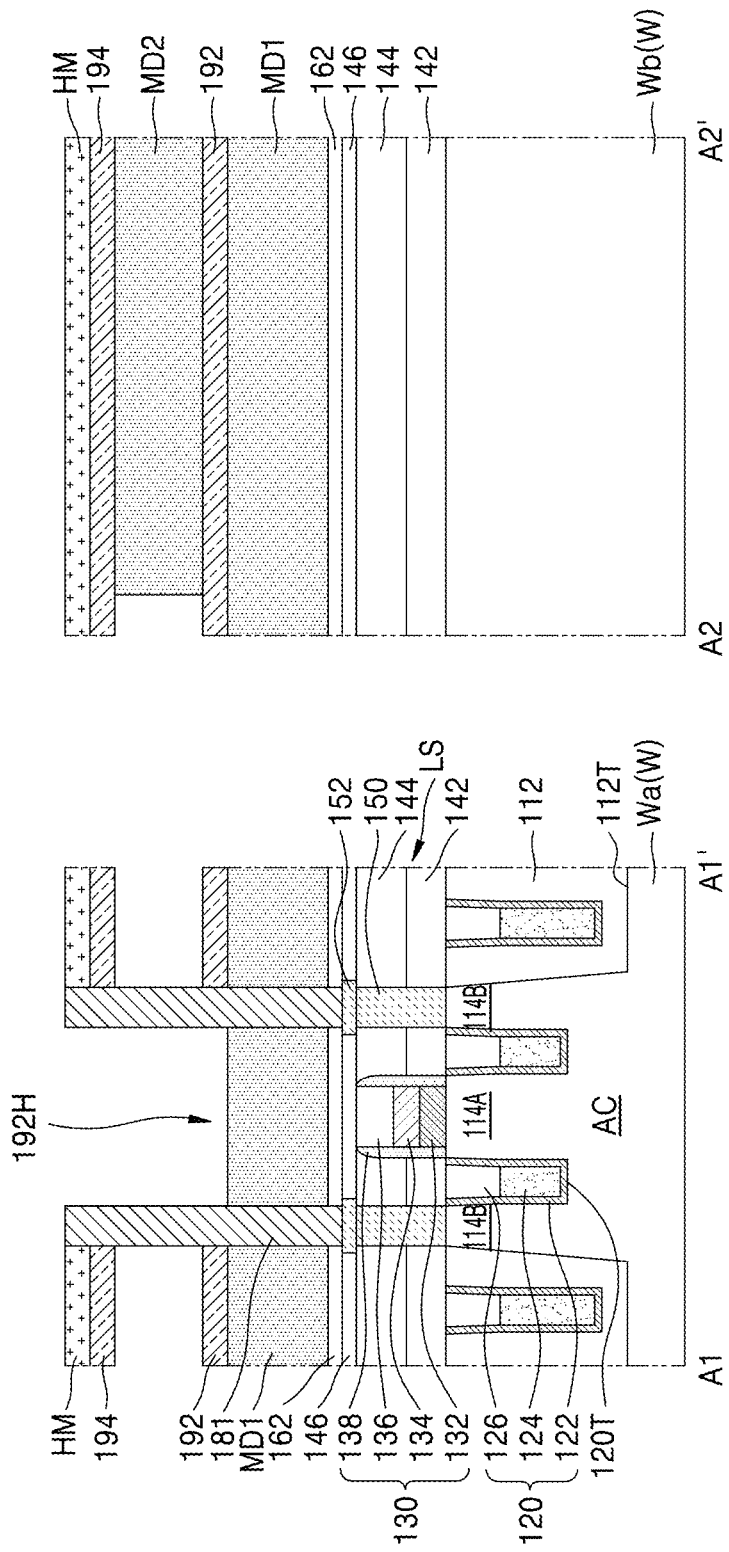

Referring to FIGS. 7F and 7G, a portion of the upper mold layer MD2 may be removed. An etchant such as a wet etchant may reach the upper mold layer MD2 through the first hole 194H and partially etch the upper mold layer MD2. Because the first hole 194H is not formed over the edge portion Wb of the wafer W, the etchant may not be able to reach the upper mold layer MD2 over the edge portion Wb of the wafer W. Therefore, a portion of the upper mold layer MD2 over the edge portion Wb of the wafer W may remain without being etched.

Next, a second hole 192H penetrating through the intermediate supporter layer 192 is formed. The second hole 192H may be formed only over the center portion Wa of the wafer W and may not be formed over the edge portion Wb of the wafer W.

Figure 7H:
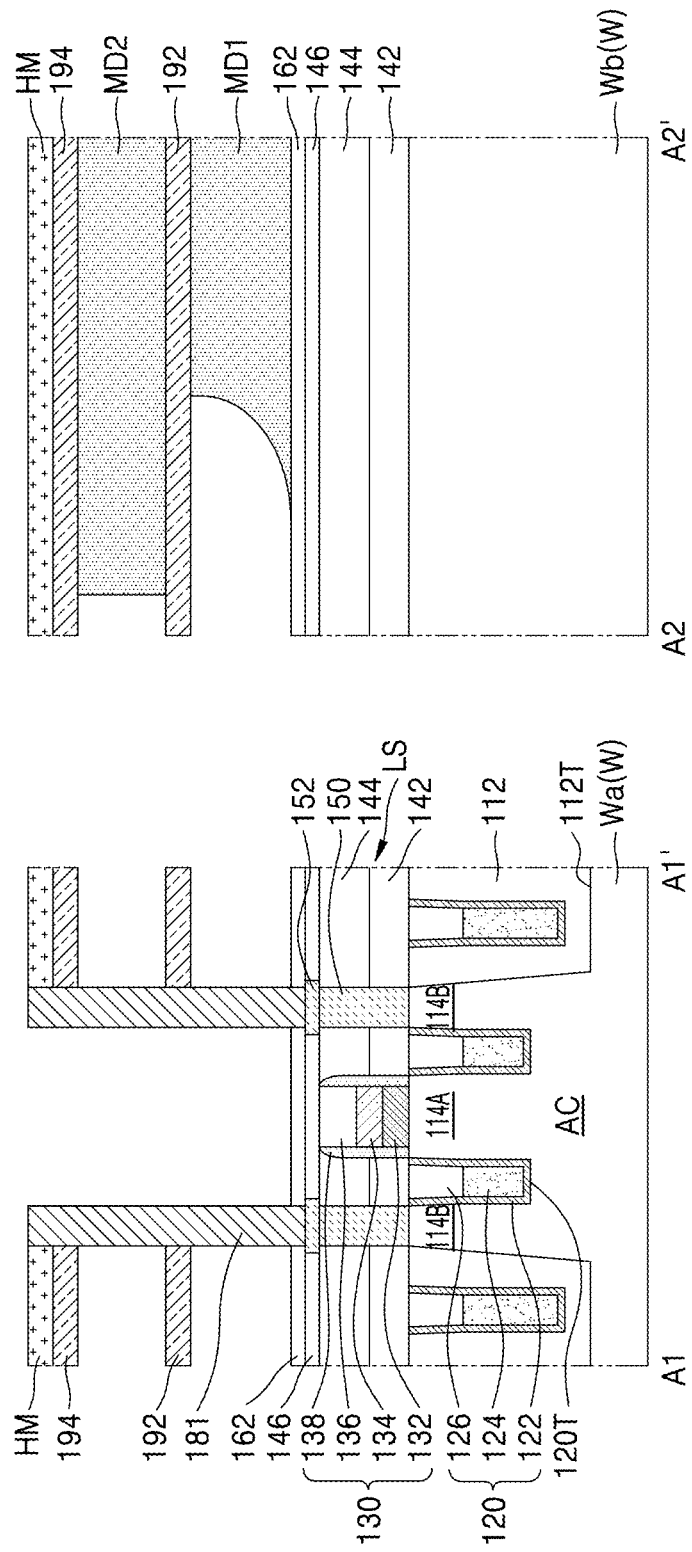

Referring to FIGS. 7G and 7H, a portion of the lower mold layer MD1 may be removed. An etchant such as a wet etchant may reach the lower mold layer MD1 through the second hole 192H and partially etch the lower mold layer MD1. Because the second hole 192H is not formed over the edge portion Wb of the wafer W, the etchant may not be able to reach the lower mold layer MD1 over the edge portion Wb of the wafer W. Therefore, a portion of the lower mold layer MD1 over the edge portion Wb of the wafer W may remain without being etched. In some embodiments, side surfaces of the remaining portion of the lower mold layer MD1 may not be parallel to side surfaces of the remaining portion of the upper mold layer MD2. In some embodiments, the area of the top surface of the lower mold layer MD1 may be less than the area of the bottom surface of the lower mold layer MD1.

The remaining portion of the lower mold layer MD1 and the remaining portion of upper mold layer MD2 may support the intermediate supporter layer 192 and the upper supporter layer 194. The intermediate supporter layer 192 and the upper supporter layer 194 may support the lower electrode 181.

Referring back to FIG. 2, the dielectric layer 180 is formed over the lower electrode 181, the etch stop layer 162, the intermediate supporter layer 192, the upper supporter layer 194, and the hard mask structure HM. Finally, the upper electrode 185 is formed on the dielectric layer 180. Therefore, the capacitor structure CA may be completed, and thus the semiconductor device 100 may be completed.

While example embodiments have been described with reference to semiconductor devices such as semiconductor devices including a capacitor, example embodiments are not limited thereto. For example, certain wafers may include structures such as semiconductor devices that do not include capacitors.

While inventive concepts has been particularly shown and described with reference to some example embodiments thereof, it will be understood that various changes in form and details may be made therein without departing from the spirit and scope of the following claims.

What is claimed is:

1. A semiconductor device comprising:
   a wafer;
   an etch stop layer on the wafer;
   a lower mold layer on the etch stop layer;
   an intermediate supporter layer on the lower mold layer;
   an upper mold layer on the intermediate supporter layer;
   an upper supporter layer on the upper mold layer; and
   a hard mask structure on the upper supporter layer,
   wherein the hard mask structure include a first hard mask layer on the upper supporter layer and a second hard mask layer on the first hard mask layer,
   one of the first hard mask layer and the second hard mask layer includes a first organic layer comprising a spin on hard (SOH) mask containing carbon (C), hydrogen (H), oxygen (O), and nitrogen (N), and
   the other one of the first hard mask layer and the second hard mask layer includes a second organic layer comprising an SOH containing C, H, and O.

2. The semiconductor device of claim 1,
   wherein a toughness of the second organic layer is greater than a toughness of the first organic layer.

3. The semiconductor device of claim 1,
   wherein the second organic layer is more ductile than the first organic layer.

4. The semiconductor device of claim 1,
   wherein a content of N in the first organic layer is about 1 atomic % to about 5 atomic %.

5. The semiconductor device of claim 1, wherein the hard mask structure further comprises:
   a third hard mask layer on the second hard mask layer, wherein
   the third hard mask layer includes a same material as the first hard mask layer.

6. The semiconductor device of claim 5, wherein the hard mask structure further comprises:
   a fourth hard mask layer on the third hard mask layer, wherein
   the fourth hard mask layer comprises a same material as the second hard mask layer.

7. The semiconductor device of claim 1, wherein the hard mask structure further comprises:
   a fifth hard mask layer between the first hard mask layer and the second hard mask layer, wherein
   the fifth hard mask layer comprises a third organic layer comprising an SOH containing C, H, O, and N, and a content of N in the fifth hard mask layer varies.

8. The semiconductor device of claim 7,
   wherein the content of N in the fifth hard mask layer continuously varies from a surface of the fifth hard mask layer contacting the first hard mask layer to a surface of the fifth hard mask layer contacting the second hard mask layer.

9. The semiconductor device of claim 7,
   wherein the fifth hard mask layer comprises a plurality of sub layers, and contents of N in different sub layers are different from one another.

10. The semiconductor device of claim 1, wherein the hard mask structure further comprises:
    a sixth hard mask layer on the second hard mask layer, wherein the sixth hard mask layer comprises a layer containing silicon (Si) and an element X, and the element X is selected form the group including boron (B), C, N, 0, or phosphorus (P).

11. The semiconductor device of claim 10, wherein the hard mask structure further comprises:

a seventh hard mask layer on the sixth hard mask layer, wherein the seventh hard mask layer comprises a layer containing Si, the element X, and an element Y, the element Y is selected form the group including B, C, N, O, or P, a content of the element X in the seventh hard mask layer decreases from a first surface of the seventh hard mask layer contacting the sixth hard mask layer to a second surface opposite to the first surface, and a content of the element Y in the seventh hard mask layer increases from the first surface of the seventh hard mask layer to the second surface of the seventh hard mask layer.

12. The semiconductor device of claim 1, wherein the hard mask structure further comprises:

a third hard mask layer on the second hard mask layer, wherein the third hard mask layer comprises an inorganic layer containing Si, an element X, and an element Y, and each of the element X and the element Y is selected from the group including B, C, N, O, or P, and the element X and the element Y are different from each other.

13. The semiconductor device of claim 12, wherein a density of the inorganic layer is lower than a density of a layer comprising Si and the element X, and a density of a layer comprising Si and the element Y.

14. The semiconductor device of claim 12, wherein the inorganic layer is porous.

15. A semiconductor device comprising:

a wafer including a non-edge portion and an edge portion around the non-edge portion;

a capacitor structure on the non-edge portion of the wafer; and a supporting structure on the edge portion of the wafer, wherein the supporting structure includes an etch stop layer, a lower mold layer, an intermediate supporter layer, an upper mold layer, an upper supporter layer, and a hard mask structure that are each sequentially stacked on the edge portion of the wafer, the supporting structure shares the etch stop layer, the intermediate supporter layer, and the upper supporter layer with the capacitor structure, the hard mask structure comprises a first hard mask layer and a second hard mask layer sequentially stacked on the upper supporter layer, one of the first hard mask layer and the second hard mask layer comprises a spin on hard mask (SOH) layer containing carbon (C), hydrogen (H), oxygen (O), and nitrogen (N), and the other one of the first hard mask layer and the second hard mask layer comprises an SOH layer containing C, H, and O.

16. The semiconductor device of claim 15, wherein the capacitor structure comprises a lower electrode on the non-edge portion of the wafer, a dielectric layer on the lower electrode, and an upper electrode on the dielectric layer, and the intermediate supporter layer and the upper supporter layer contact the lower electrode.

17. The semiconductor device of claim 15, wherein sidewalls of the lower mold layer are not parallel to sidewalls of the upper mold layer.

18. The semiconductor device of claim 15, wherein an area of a top surface of the lower mold layer is greater than an area of a bottom surface of the lower mold layer.

19. The semiconductor device of claim 15, further comprising:

a plurality of transistors arranged at the non-edge portion of the wafer.

20. A semiconductor device comprising:

a wafer comprising a non-edge portion and an edge portion around the non-edge portion;

a capacitor structure on the non-edge portion of the wafer; and a supporting structure on the edge portion of the wafer, wherein the capacitor structure includes an etch stop layer, an intermediate supporter layer apart from the etch stop layer in a vertical direction, an upper supporter layer apart from the intermediate supporter layer in the vertical direction, a plurality of lower electrodes penetrating through the etch stop layer, the intermediate supporter layer, and the upper supporter layer, a dielectric layer on the lower electrodes, and an upper electrode on the dielectric layer, the supporting structure shares the etch stop layer, the intermediate supporter layer, and the upper supporter layer with the capacitor structure and further comprises an upper mold layer between the etch stop layer and the intermediate supporter layer, an upper mold layer between the intermediate supporter layer and the upper supporter layer, and a hard mask structure on the upper supporter layer, the hard mask structure includes a first hard mask layer and a second hard mask layer sequentially stacked on the upper supporter layer, one of the first hard mask layer and the second hard mask layer comprises a spin on hard mask (SOH) layer containing carbon (C), hydrogen (H), oxygen (O), and nitrogen (N), and the other one of the first hard mask layer and the second hard mask layer comprises an SOH layer containing C, H, and O.

* * * * *